(12) United States Patent
Shirakawa

(10) Patent No.: US 8,982,623 B2
(45) Date of Patent: Mar. 17, 2015

(54) NONVOLATILE SEMICONDUCTOR MEMORY DEVICE

(71) Applicant: Kabushiki Kaisha Toshiba, Tokyo (JP)

(72) Inventor: Masanobu Shirakawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 13/783,374

(22) Filed: Mar. 3, 2013

(65) Prior Publication Data

US 2013/0329494 A1 Dec. 12, 2013

(30) Foreign Application Priority Data

Jun. 6, 2012 (JP) .................................. 2012-129115

(51) Int. Cl.
| | | |
|---|---|---|
| G11C 11/34 | (2006.01) | |
| G11C 16/06 | (2006.01) | |
| G11C 29/00 | (2006.01) | |
| G11C 16/20 | (2006.01) | |
| G11C 16/04 | (2006.01) | |
| G11C 29/02 | (2006.01) | |
| G11C 29/44 | (2006.01) | |
| G11C 29/12 | (2006.01) | |

(52) U.S. Cl.
CPC .............. *G11C 16/06* (2013.01); *G11C 29/846* (2013.01); *G11C 16/20* (2013.01); *G11C 29/789* (2013.01); *G11C 29/808* (2013.01); *G11C 16/0483* (2013.01); *G11C 29/025* (2013.01); *G11C 29/026* (2013.01); *G11C 29/44* (2013.01); *G11C 2029/1204* (2013.01); *G11C 2029/4402* (2013.01)

USPC ............ 365/185.08; 365/185.09; 365/185.11; 365/185.12; 365/185.17; 365/185.22; 365/185.33

(58) Field of Classification Search
USPC ............. 365/185.08, 185.09, 185.11, 185.12, 365/185.17, 185.22, 185.33
See application file for complete search history.

(56) References Cited

U.S. PATENT DOCUMENTS

| | | | | |
|---|---|---|---|---|
| 6,751,121 | B2 * | 6/2004 | Marotta ................... | 365/185.09 |
| 7,193,895 | B2 * | 3/2007 | Jin et al. ................... | 365/185.09 |
| 8,599,613 | B2 * | 12/2013 | Abiko et al. ............. | 365/185.09 |
| 8,711,625 | B2 * | 4/2014 | Li et al. .................... | 365/185.09 |
| 2006/0079695 | A1 | 4/2006 | Gravestock et al. | |
| 2010/0290299 | A1 | 11/2010 | Matsumoto et al. | |

FOREIGN PATENT DOCUMENTS

| | | |
|---|---|---|
| JP | 2002-288994 | 10/2002 |
| JP | 2004-158069 | 6/2004 |
| JP | 2008-226355 | 9/2008 |
| JP | 2010-267310 A | 11/2010 |

* cited by examiner

*Primary Examiner* — Trong Phan
(74) *Attorney, Agent, or Firm* — Patterson & Sheridan, LLP

(57) ABSTRACT

A non-volatile semiconductor memory device has memory cell arrays, with the memory cells arranged in a matrix configuration and divided into p areas in the column direction, a column redundancy area arranged in a portion of the memory cell array and having redundancy columns that can substitute for defective user data columns, and a column substituting register that holds the column substituting information for substituting the defective user data columns of the selected area with the redundancy columns.

20 Claims, 27 Drawing Sheets

Fig. 16A

|      | Flag1 | Flag0 | SUBSTITUTING ORIGIN ADDRESS |
|------|-------|-------|-----------------------------|
| CRD5 | 0     | 0     | 1FFF                        |
| CRD4 | 0     | 0     | 1FFF                        |
| CRD3 | 1     | 0     | 1FFF                        |
| CRD2 | 0     | 0     | 1FFF                        |
| CRD1 | 0     | 1     | 100                         |

Fig. 16B

|      | Flag1 | Flag0 | SUBSTITUTING ORIGIN ADDRESS |
|------|-------|-------|-----------------------------|
| CRD5 | 0     | 0     | 1FFF                        |
| CRD4 | 1     | 0     | 1FFF                        |
| CRD3 | 1     | 0     | 1FFF                        |
| CRD2 | 0     | 0     | 1FFF                        |
| CRD1 | 0     | 0     | 1FFF                        |

Fig. 16C

|      | Flag1 | Flag0 | SUBSTITUTING ORIGIN ADDRESS |
|------|-------|-------|-----------------------------|
| CRD5 | 0     | 0     | 1FFF                        |
| CRD4 | 1     | 0     | 1FFF                        |
| CRD3 | 1     | 0     | 1FFF                        |
| CRD2 | 0     | 0     | 1FFF                        |
| CRD1 | 0     | 1     | 100                         |

|  | Flag1 | Flag0 | SUBSTITUTING ORIGIN ADDRESS |
|---|---|---|---|
| CRD5 | 0 | 0 | 1FFF |
| CRD4 | 1 | 0 | 1FFF |
| CRD3 | 1 | 0 | 1FFF |
| CRD2 | 0 | 1 | 200 |
| CRD1 | 0 | 1 | 100 |

Fig. 18

| | | | | | | | | |
|---|---|---|---|---|---|---|---|---|
| REDUNDANCY AREA | CRD16 | ISOLAT_G | ISOLAT_L | DL0[8:1] | DL1[8:1] | DL2[8:1] | SA[8:1] | BL[8:1] |
| | CRD15 | ISOLAT_G | ISOLAT_L | DL0[8:1] | DL1[8:1] | DL2[8:1] | SA[8:1] | BL[8:1] |
| | CRD14 | ISOLAT_G | ISOLAT_L | DL0[8:1] | DL1[8:1] | DL2[8:1] | SA[8:1] | BL[8:1] |
| | CRD13 | ISOLAT_G | ISOLAT_L | DL0[8:1] | DL1[8:1] | DL2[8:1] | SA[8:1] | BL[8:1] |
| | CRD12 | ISOLAT_G | ISOLAT_L | DL0[8:1] | DL1[8:1] | DL2[8:1] | SA[8:1] | BL[8:1] |
| | CRD11 | ISOLAT_G | ISOLAT_L | DL0[8:1] | DL1[8:1] | DL2[8:1] | SA[8:1] | BL[8:1] |
| | CRD10 | ISOLAT_G | ISOLAT_L | DL0[8:1] | DL1[8:1] | DL2[8:1] | SA[8:1] | BL[8:1] |
| | CRD9 | ISOLAT_G | ISOLAT_L | DL0[8:1] | DL1[8:1] | DL2[8:1] | SA[8:1] | BL[8:1] |
| | CRD8 | ISOLAT_G | ISOLAT_L | DL0[8:1] | DL1[8:1] | DL2[8:1] | SA[8:1] | BL[8:1] |
| | CRD7 | ISOLAT_G | ISOLAT_L | DL0[8:1] | DL1[8:1] | DL2[8:1] | SA[8:1] | BL[8:1] |
| | CRD6 | ISOLAT_G | ISOLAT_L | DL0[8:1] | DL1[8:1] | DL2[8:1] | SA[8:1] | BL[8:1] |
| | CRD5 | ISOLAT_G | ISOLAT_L | DL0[8:1] | DL1[8:1] | DL2[8:1] | SA[8:1] | BL[8:1] |
| | CRD4 | ISOLAT_G | ISOLAT_L | DL0[8:1] | DL1[8:1] | DL2[8:1] | SA[8:1] | BL[8:1] |
| | CRD3 | ISOLAT_G | ISOLAT_L | DL0[8:1] | DL1[8:1] | DL2[8:1] | SA[8:1] | BL[8:1] |
| | CRD2 | ISOLAT_G | ISOLAT_L | DL0[8:1] | DL1[8:1] | DL2[8:1] | SA[8:1] | BL[8:1] |
| | CRD1 | ISOLAT_G | ISOLAT_L | DL0[8:1] | DL1[8:1] | DL2[8:1] | SA[8:1] | BL[8:1] |
| NORMAL AREA | Col 2048 | ISOLAT_G | ISOLAT_L | DL0[8:1] | DL1[8:1] | DL2[8:1] | SA[8:1] | BL[8:1] |
| | Col 2047 | ISOLAT_G | ISOLAT_L | DL0[8:1] | DL1[8:1] | DL2[8:1] | SA[8:1] | BL[8:1] |
| | Col 2046 | ISOLAT_G | ISOLAT_L | DL0[8:1] | DL1[8:1] | DL2[8:1] | SA[8:1] | BL[8:1] |
| | ⋮ | | | | | | | |
| | Col 2 | ISOLAT_G | ISOLAT_L | DL0[8:1] | DL1[8:1] | DL2[8:1] | SA[8:1] | BL[8:1] |
| | Col 1 | ISOLAT_G | ISOLAT_L | DL0[8:1] | DL1[8:1] | DL2[8:1] | SA[8:1] | BL[8:1] |

*Fig. 19A*

|  | Flag3 | Flag2 | Flag1 | Flag0 | SUBSTITUTING ORIGIN COLUMN ADDRESS |
|---|---|---|---|---|---|
| CRD16 | 0 | 0 | 0 | 0 | - |
| CRD15 | 0 | 0 | 0 | 0 | - |
| CRD14 | 0 | 0 | 0 | 0 | - |
| CRD13 | 0 | 0 | 0 | 0 | - |
| CRD12 | 0 | 0 | 0 | 1 | Col 1200 |
| CRD11 | 0 | 0 | 1 | 1 | Col 1100 |
| CRD10 | 0 | 1 | 0 | 0 | Col 1000 |
| CRD9 | 0 | 1 | 0 | 0 | Col 900 |
| CRD8 | 0 | 1 | 0 | 0 | Col 800 |
| CRD7 | 0 | 1 | 0 | 0 | Col 700 |
| CRD6 | 0 | 1 | 0 | 0 | Col 600 |
| CRD5 | 0 | 1 | 0 | 0 | Col 500 |
| CRD4 | 0 | 1 | 0 | 0 | Col 400 |
| CRD3 | 1 | 1 | 0 | 0 | Col 300 |
| CRD2 | 0 | 1 | 0 | 0 | Col 200 |
| CRD1 | 1 | 1 | 0 | 0 | Col 100 |

*Fig. 19B*

|  | Flag3 | Flag2 | Flag1 | Flag0 | SUBSTITUTING ORIGIN COLUMN ADDRESS |
|---|---|---|---|---|---|
| CRD16 | 0 | 0 | 0 | 0 | - |
| CRD15 | 0 | 0 | 0 | 0 | Col 100 |
| CRD14 | 0 | 0 | 0 | 0 | Col 300 |
| CRD13 | 0 | 0 | 0 | 1 | Col 400 |
| CRD12 | 0 | 0 | 0 | 1 | Col 1200 |
| CRD11 | 0 | 0 | 1 | 1 | Col 1100 |
| CRD10 | 0 | 1 | 0 | 0 | Col 1000 |
| CRD9 | 0 | 1 | 0 | 0 | Col 900 |
| CRD8 | 0 | 1 | 0 | 0 | Col 800 |
| CRD7 | 0 | 1 | 0 | 0 | Col 700 |
| CRD6 | 0 | 1 | 0 | 0 | Col 600 |
| CRD5 | 0 | 1 | 0 | 0 | Col 500 |
| CRD4 | 0 | 1 | 1 | 1 | Col 400 |
| CRD3 | 1 | 1 | 0 | 0 | Col 300 |
| CRD2 | 0 | 1 | 0 | 0 | Col 200 |
| CRD1 | 1 | 1 | 0 | 0 | Col 100 |

NONVOLATILE SEMICONDUCTOR MEMORY DEVICE

CROSS-REFERENCE TO RELATED APPLICATION

This application is based upon and claims the benefit of priority from Japanese Patent Application No. 2012-129115, filed Jun. 6, 2012, the entire contents of which are incorporated herein by reference.

FIELD

Embodiments described herein relate to a nonvolatile semiconductor memory device.

BACKGROUND

In the recent years, a laminated type semiconductor memory known as BiCS (Bit Cost Scalable) memory has been developed.

DESCRIPTION OF THE DRAWINGS

FIGS. 16A to 16D illustrate examples of the column substituting information set in the column substituting register in the nonvolatile semiconductor memory device shown in FIG. 7.

FIG. 17 is a flow chart illustrating the boot treatment of the nonvolatile semiconductor memory device shown in FIG. 7.

FIG. 18 is a diagram illustrating an example of the column constitution of the nonvolatile semiconductor memory device shown in FIG. 7.

FIG. 19A is a diagram illustrating an example of the column substituting information in the selected area according to a third embodiment. FIG. 19B is a diagram illustrating an example of the substitution of the redundancy columns when the redundancy columns are defective.

DETAILED DESCRIPTION

Embodiments provide a nonvolatile semiconductor memory device that can improve the efficiency in defect recovery.

In general, according to one embodiment, the nonvolatile semiconductor memory devices according to the embodiments will be explained with reference to figures. However, the present invention is not limited to the embodiments described herein.

The nonvolatile semiconductor memory device according to an embodiment has a memory cell array, a column redundancy area, and a column substituting register. The memory cell array has a matrix-shaped configuration that is divided into p (p is an integer of 2 or larger) areas in the column direction. The column redundancy area is arranged in a portion of the memory cell array, and it has redundancy columns that can substitute for any defective user data columns arranged in the memory cell array. The column substituting register holds the column substituting information for substituting the defective user data columns of the selected area with the redundancy columns.

(First Embodiment)

1. Overall Constitution

Figure 1:
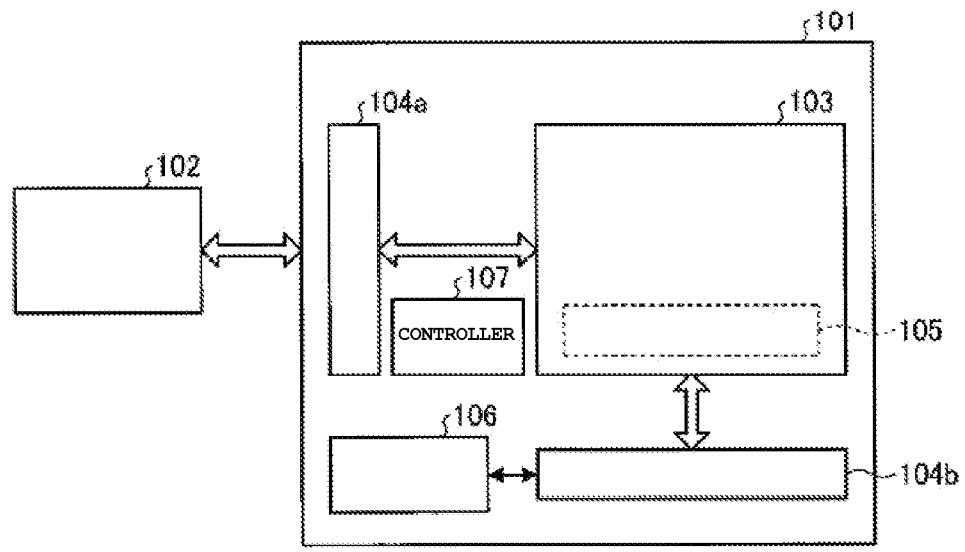
FIG. 1 is a schematic block diagram illustrating the nonvolatile semiconductor memory device according to a first embodiment.
Figure 2:
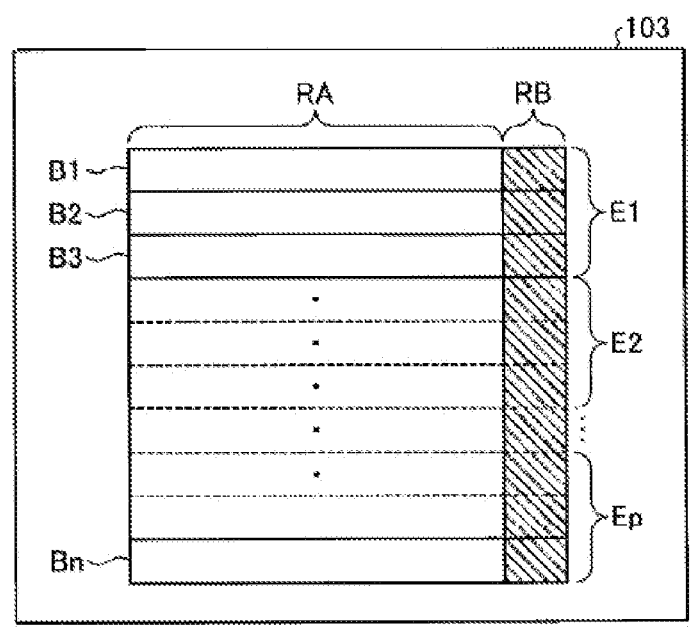
FIG. 2 is a schematic block diagram illustrating the memory cell array of the nonvolatile semiconductor memory device shown in FIG. 1.
Figure 3:
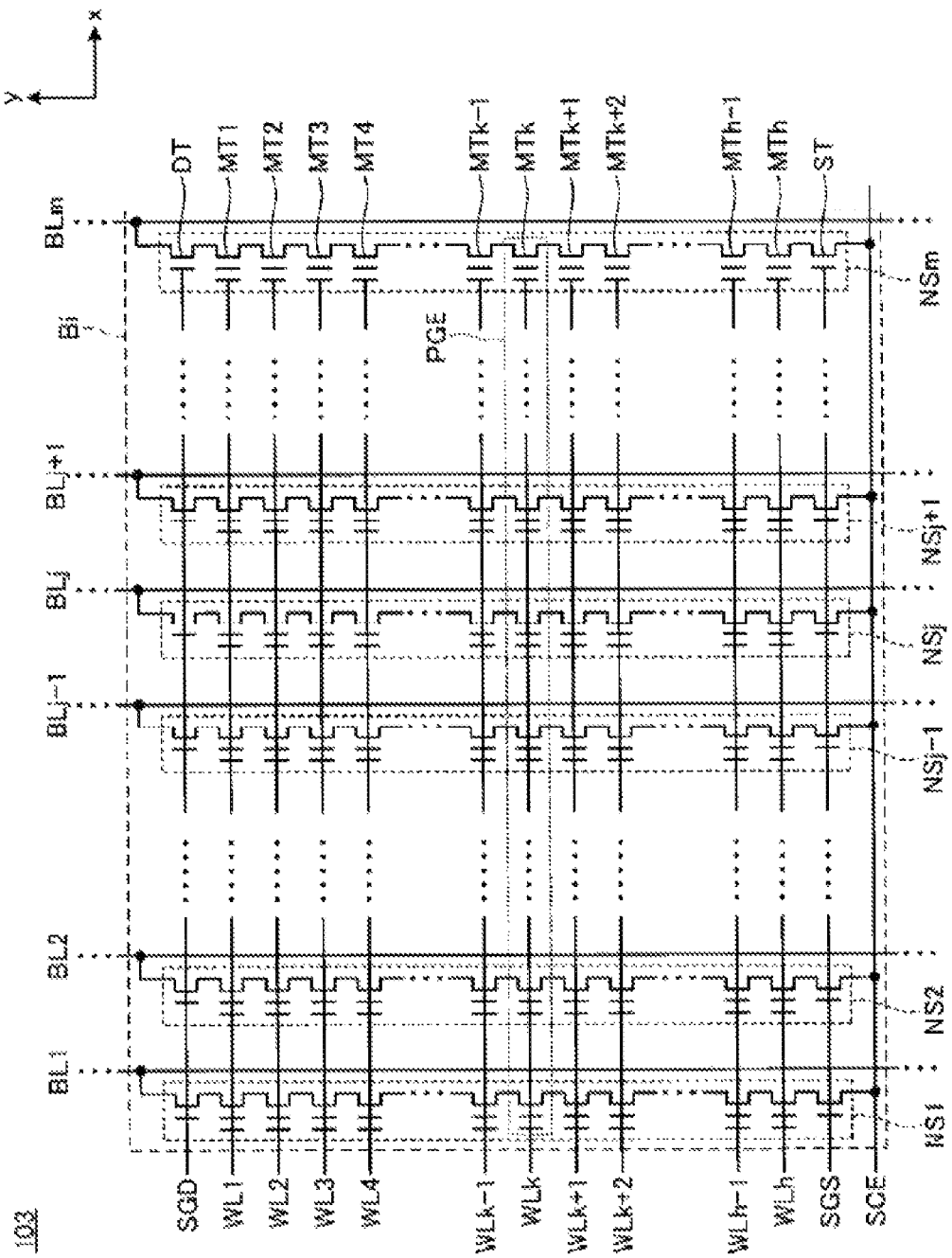
FIG. 3 is a circuit diagram illustrating the schematic constitution of the blocks of the memory cell array shown in FIG. 2.

FIG. 1 is a schematic block diagram illustrating the constitution of the nonvolatile semiconductor memory device according to the first embodiment. Here, the nonvolatile semiconductor memory device may be either a two-dimensional so-called planar NAND flash memory, a BiCS memory or another three-dimensional NAND flash memory. In order to facilitate the explanation, the following explanation will be focused on the planar NAND flash memory as an example. FIG. 2 is a schematic block diagram illustrating the constitution of the memory cell array of the nonvolatile semiconductor memory device shown in FIG. 1. FIG. 3 is a circuit diagram illustrating schematically the constitution of the blocks of the memory cell array shown in FIG. 2.

As shown in FIG. 1, the nonvolatile semiconductor memory device has a NAND flash memory 101 and a controller 102 that carries out the drive control of the NAND flash memory 101. The NAND flash memory 101 is electrically connected to the controller 102.

The NAND flash memory 101 has a memory cell array 103, a row selecting control section 104a, a column selection control section 104b, a column substituting register 106, and a controller 107. As shown in FIG. 3, the memory cell array 103 has memory cells arranged in a matrix configuration in the X-direction and the Y-direction. Also, as shown in FIG. 2, the memory cell array 103 has a normal data region RA that can hold the normal data and a column redundancy region having the redundancy columns RB that can be substitutes for the defective columns of the normal data region RA. Here, the normal data region and the redundancy region each are divided into p (p is an integers of 2 or larger) areas E1 to Ep. Also, there are ra columns in the normal data region RA, and there are rb columns in the redundancy region RB.

The memory cell array 103 has ROM fuse 105. The ROM fuse 105 can register the column substituting information of the p areas E1 to Ep. Here, in the ROM fuse 105, in addition to the column substituting information, the voltage value trimming information and the bad block information may also be registered.

The column substituting information is the information with the following feature: when the selected area has a defective column, the information shows which redundancy column is to be substituted for the defective column; that is, it is the information indicating the corresponding relationship between the defective column and the redundancy column as the substituting destination. The column substituting information contains the global defective column and the local defective column. Here, the global defective column refers to the global defective column common for all of the p areas, and the local defective column refers to the individual local defective column for one area. With the column substituting information, it is possible to substitute the global defective column or the local defective column.

The global defective column includes the open/short defects of the bit lines for example. In addition, there are defects of the sense amplifiers, defects of data latch, etc. The local defective column includes the defective film of the charge storage layer, other cell defects, defects in the through holes (memory holes) through the memory cell layer and other defects of processing, the embedding defects of the memory holes, and defects of other openings of the memory holes. For example, for the defective processing of the memory holes and contacts, the range of connection by the memory holes and contacts is 2 blocks that share the contact for a planar NAND flash memory, and it is the 1-string unit (to be explained in detail later) for a three-dimensional NAND flash memory.

In data read and write operations, the row selecting control section 104a carries out row selection and control of the applied voltage of the memory cell array 103. During the data read and write operations, the column selection control section 104b carries out the column selection and control of the applied voltage of the memory cell array 103. The column substituting register 106 can hold the column substituting information of the selected area. The column substituting information of the selected area is read from the ROM fuse 105.

As shown in FIG. 2, the memory cell array 103 has a normal data region RA that allows user access and a column redundancy region RB that does not allow user access. Also, in the column redundancy region RB, the redundancy columns that can be substituted for the defective columns are arranged.

Additionally, the memory cell array 103 is divided into n (n is an integers of 2 or larger) blocks B1 to Bn. In addition, the memory cell array 103 is divided to p areas E1 to Ep (p is an integer of 2 or larger and n or smaller; p n). In addition, the areas E1 to Ep each contain at least one or more blocks B1 to Bn. In this case, it is not required that the number of the blocks B1 to Bn contained in each of areas E1 to Ep be the same for the various areas E1 to Ep. That is, different areas E1 to Ep may have different numbers of the blocks. Also, it is not a necessity to arrange the blocks B1 to Bn contained in each of areas E1 to Ep to be continuous to each other. The blocks B1 to Bn may also be contained in each of the same areas E1 to Ep discontinuously.

As shown in FIG. 3, block Bi (i is an integer in the range of 1 to n or 1≤i<n) has m NAND strings NS1 to NSm in the x-direction. The NAND strings NS1 to NSm are connected to the bit lines BL1 to BLm, respectively. The block Bi has h (h is a positive integer) word lines WL1 to WLh, select gate lines SGD, SGS, and source line SCE. Also, in the blocks B1 to Bn, m (m is a multiple of 8) bit lines BL1 to BLm are commonly arranged. There are 8 bit lines BL for 1 column. For example, if there are ra columns in the normal data region RA, there are rb columns in the column redundancy region RB, and m meets the following formula:

$$m = (ra+rb)*8$$

Here, in the NAND strings NS1 to NSm, cell transistors MT1 to MTh and select transistors DT, ST are arranged, respectively. One memory cell in the memory cell array 103 may be one cell transistor MTk (k is an integer in the range of 1 to h or 1≤k≤h). In each of the cell transistors MT1 to MTh, a charge accumulating region for accumulating the charge and a control gate for controlling charge accumulation are arranged. Here, the cell transistors MT1 to MTh are connected in series. Then, the select transistor DT is connected in series to the cell transistor MT1, while the select transistor ST is connected in series with the cell transistor MTh.

Here, in the NAND strings NS1 to NSm, the word lines WL1 to WLh are connected to the control gates of the cell transistors MT1 to MTh, respectively. In addition, the bit line BLj is connected via the select transistor DT to one end of the NAND string NSj, and the other end of the NAND string NSj is connected via the select transistor ST to the source line SCE.

In addition, in the NAND strings NS1 to NSm, in the case of the single level cell (the so-called SLC), the page PGE is composed of m memory cells made of cell transistors MTk connected to the word lines WLk. In this case, 1 page includes (ra+rb) bytes. The page is the unit for the writing of data in the memory cells and the unit for the reading of data in the memory cells. In addition, the data quantity that can be used by the user in 1 page has ra bytes.

Figure 4:
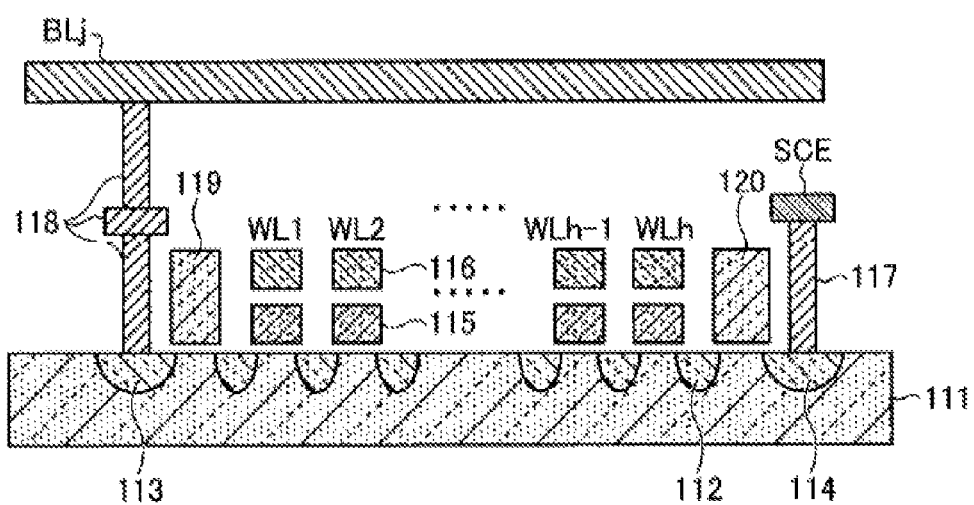
FIG. 4 is a cross-sectional view illustrating schematically the constitution of the 1-NAND string portion of the nonvolatile semiconductor memory device shown in FIG. 1.

FIG. 4 is a cross-sectional view illustrating schematically the portion of 1 NAND string of the nonvolatile semiconductor memory device shown in FIG. 1.

As shown in FIG. 4, a charge storage layer 115 and select gate electrodes 119 and 120 are arranged via the interlayer insulating film (not shown in the figure) on the well 111, and a control gate 116 is arranged via an interlayer insulating film (not shown in the figure) on the charge storage layer 115. In the planar NAND flash memory, a floating gate can be adopted as the charge storage layer 115.

Impurity diffusion layers 112, 113, and 114 are arranged; and the charge storage layer 115 is formed between the select gate electrodes 119 and 120. Here, for example, the well 111 is formed as, for example, the p-type, and the impurity diffusion layers 112, 113 and 114 are formed as, for example, the n-type.

Here, the impurity diffusion layer 113 is connected via the connecting conductor 118 to the bit line BLj, and the impurity diffusion layer 114 is connected via the connecting conductor 117 to the source line SCE. In addition, the control gates 116 of the various memory cells are connected to the word lines WL1 to WLh, and the select gate electrodes 119 and 120 are connected to the select gate lines SGD and SGS, respectively.

In the write operation, the program voltage Vpp (e.g., 20 V) is applied on the selected word line WLk of the block Bi. On the other hand, on the non-selected word lines WL1 to WLk−1, WLk+1 to WLh, an intermediate voltage Vpass (e.g., 10 V) that is sufficient to turn on the cell transistors MT1 to MTk−1 is applied.

In addition, on the bit line BLj of the block Bi, a write voltage corresponding to the write data (e.g., 0 V) or a write-inhibiting voltage (e.g., 2.5 V) is applied. For example, when data write is carried out, on the page, a voltage of 0 V is applied on the bit line BLj with write data of "0", and a voltage of 2.5 V is applied on the bit line BLj with the data of "1".

In the read operation, a read voltage (e.g., 0 V) is applied on the selected word line WLk of the block Bi, and an intermediate voltage (e.g., 4.5 V) that is sufficient to turn on the cell transistors MT1 to MTk−1 and MTk+1 to MTh is applied on the non-selected word lines WL1 to WLk−1 and WLk+1 to WLh. An intermediate voltage (e.g., 4.5 V) sufficient to turn on the selected transistors DT and ST is applied on the select gate lines SGD and SGS; a precharge voltage is applied on the bit line BLj; and 0 V is applied on the source line SCE.

At this time, if the threshold of the cell transistor is lower than the read level, the charge charged on the bit line BLj is discharged via the NAND string NSj, and the potential of the bit line BLj becomes the low level. On the other hand, if the threshold of the cell transistor has reached the read level, the charge charged on the bit line BLj is not discharged via the NAND string NSj, and the potential of the bit line BLj is kept on the high level.

Here, determination is made as to whether the potential of the bit line BLj reached the low level or high level to determine whether the threshold of the cell transistor reaches the read level and to read the data stored in the cell transistor.

In the erase operation, 0 V is applied on the word lines WL1 to WLh of the block Bi, and the well potential of the block Bi is set at the erase voltage Ve (e.g., 17 V). In addition, it is possible to set the source line SCE and select gate lines SGD and SGS of the block Bi in the floating state.

Figure 5:
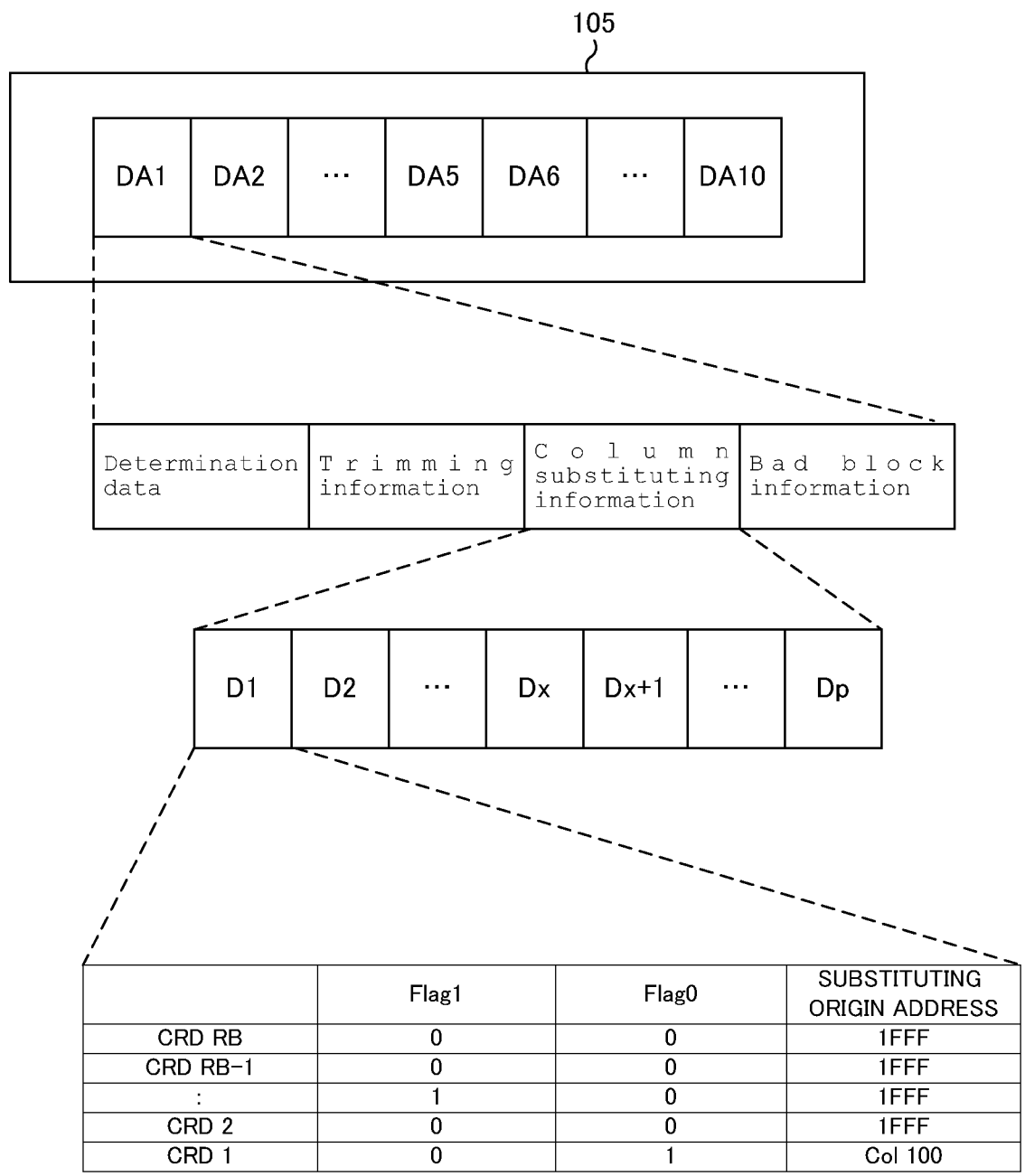
FIG. 5 is illustrates an example of a registration method for a first information.

FIG. 5 is a diagram illustrating an example of the method for registering the first information DA1 to DP10 registered in the ROM fuse 105 shown in FIG. 1. In FIG. 5, we use 10 control information DA1 to DA10 for ease of explanation. The number of the control information is not limited to this number. The control information DA1 is same as remain control information DA2 to DA10. Therefore we only explain the control information DA1 for ease of explanation.

As shown in FIG. 5, the control information DA1 includes a determination data, a trimming information, a column substituting information, and a bad block information. The determination data is used for whether the control information DA1 has a detective data or not. For example the controller circuit 107 reads the determination data in the ROM fuse 105 before the controller circuit 107 reads the substituting information D1 to Dp from the ROM fuse 105 in a power-on state.

The trimming information includes the voltage value trimming information described as above.

As shown in FIG. 5, the column substituting information pieces D1 to Dp corresponding to the areas E1 to Ep shown in FIG. 2 are registered in the ROM fuse 105 shown in FIG. 1. By the column substituting information pieces D1 to Dp, in all of the p areas, substitution can be made for the common global defective column, and, in each area, substituting can be made for the individual local defective column. In addition to the information indicating which column in each area is defective, the column substituting information pieces D1 to Dp also contain the information indicating the corresponding relationship between the defective column and the redundancy column of the substituting destination.

As shown in FIG. 5, when the redundancy column CRD has rb bytes, for each redundancy column (CRD1, CRD2, . . . , CRD RB-1, and CRD RB), the control information including the flags Flag0 and Flag1 and the substituting origin address is set. The column substituting information pieces D1 to Dp each hold Flag0 and Flag1 and the substituting origin address. Here, flag Flag0 is an index indicating whether the redundancy column is a defective column. On the other hand, the flag Flag1 is an index indicating whether the redundancy column is adopted as a substitution for the defective column. The flags Flag0 and Flag1 will be explained in detail later.

The following explains the example in which the column substituting information Dj (j is an integer with 1≤j≤p) with the following content is kept in the ROM fuse 105: there exists a column defect in a certain column of the area Ej, and the substitution destination of this column is the redundancy column of the same area Ej.

For example, as shown in FIG. 5, after the die sort test operation, for all of the areas E1 to Ep, the column substituting information pieces D1 to Dp are registered in the ROM fuse 105.

In the power-on state, the controller circuit 107 reads the determination data in the control information DA0 for example. when the controller circuit 107 judges that a pattern of the determination data readout from the control information DA0 is a desired pattern, the column substituting information Dx corresponding to the area Ex (the area containing the management block) initially accessed by the NAND flash memory 101 from the ROM fuse 105 under control of the controller circuit 107 in the NAND flash memory 101 is read, and it is set in the column substituting register 106.

Here, when access (such as the read operation, write operation, etc.) is made to the memory cell array 103, the controller 107 takes the column substituting information Dx from the column substituting register 106 as a reference.

The controller 107 takes the portion corresponding to the column address and determines whether the portion is registered as a defect of column in the column substituting information Dx.

Here, when the selected column address is registered as a defect of column, the controller 107 accesses the redundancy column of the substituting destination on the basis of the column substituting information Dx.

The following explains the case in which the areas E1 to Ep different from the area Ex are assigned by the row address. Here, the area selected by the assigned row address is taken as area Ex+1.

In this case, the controller 107 reads the corresponding column substituting information Dx+1 from the ROM fuse 105 and sets it in the column substituting register 106. The controller 107 takes the column substituting information Dx+1 of the column substituting register 106 as a reference.

Similarly, the controller 107 takes the portion of the column substituting information Dx+1 corresponding to the selected column address, and it determines whether there is a defective column (i.e., global defective column or local defective column).

Then, when there is defective column in the selected column address, the control circuit 107 accesses the redundancy column of the substituting destination on the basis of the column substituting information Dx+1.

Figure 6A:
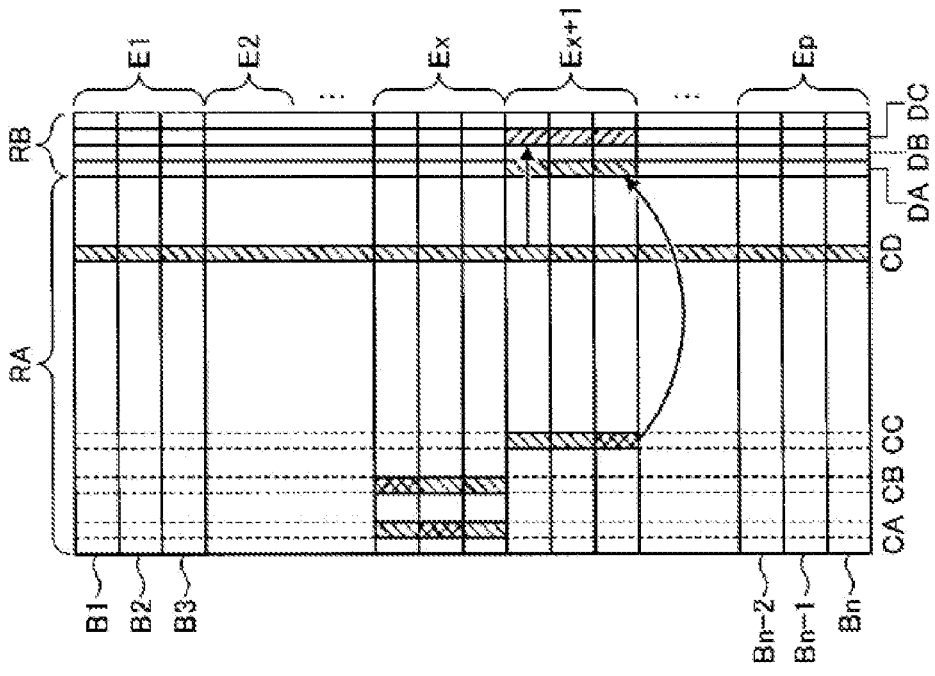
FIG. 6A is a schematic diagram illustrating the column substituting method before the area switch of the memory cell array shown in FIG. 2.
Figure 6B:
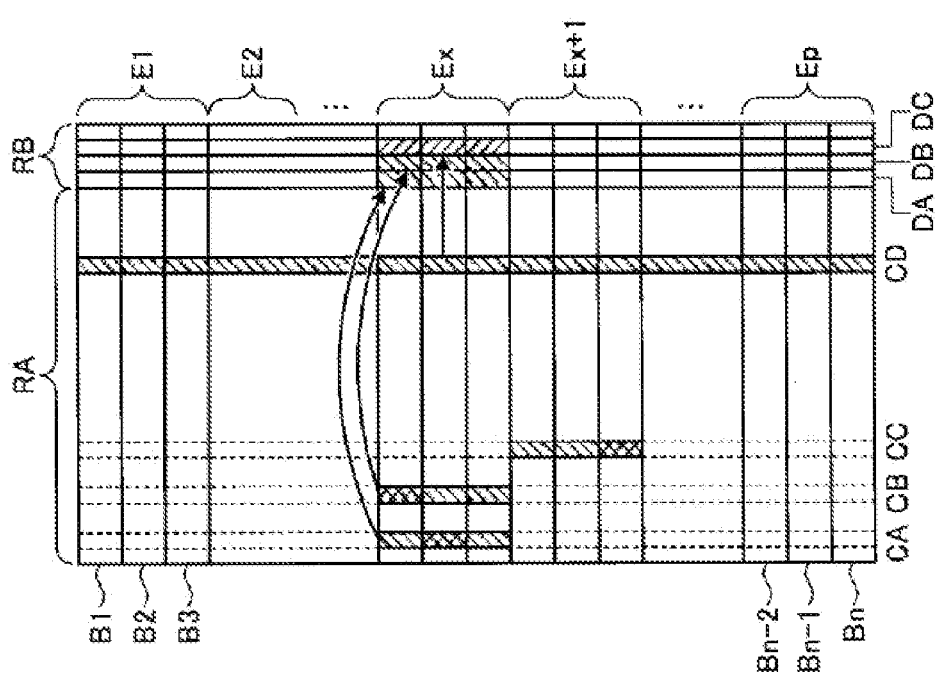
FIG. 6B is a schematic diagram illustrating an example of the column substituting method after the area switch of the memory cell array shown in FIG. 2.

FIG. 6A is a block diagram illustrating the column substituting method before the area switch. FIG. 6B is a block diagram illustrating an example of the column substituting method after the area switch. In order to facilitate the explanation, the following describes the column substituting method when areas Ex and Ex+1 are selected as an example. In addition, in the example shown in FIGS. 6A and 6B, 3 blocks are contained in 1 area.

In order to facilitate the explanation, the global defective column and the local defective column of each area will be explained with respect to the following example. As shown in FIGS. 6A and 6B, in the area Ex, there are local defective columns in columns CA and CB, and there is a local defective column in column CC in area Ex+1. Also, it is assumed that there is a global defective column in the column CD.

The column substituting information Dx is information indicating that the columns CA, CB, and CD are defective columns; the redundancy column as the substituting destination of the column CA is the column DA; the redundancy column as the substituting destination of the column CB is the column DB; and the redundancy column as the substituting destination of the column CD is the column DC.

Similarly, the column substituting information Dx+1 is information indicating that there are defective columns in the columns CC and CD; the redundancy column as the substituting destination of the column CC is the column DA; and the redundancy column as the substituting destination of the column CD is the column DC.

In addition, for example, when the defect of the column CA in the area Ex is the local defective column of 1 block among the 3 blocks (for example, suppose that the defect is the opening defect caused by passing of the connecting conductor 118 shown in FIG. 4 in the NAND strings NS1 when the bit line BL1 shown in FIG. 3 belongs to the column CA), even when there is no defective column in the remaining 2 blocks of the column CA, the 3-block column CA of the area Ex is still substituted in bloc by the redundancy column DA.

In the power-on state, the controller 107 reads the desired column substituting information (initial information) and sets it in the column substituting register 106.

Then, when the selected row address belongs to area Ex, as shown in FIG. 6A, the controller 107 reads the column substituting information Dx and sets it in the column substituting register 106. Then, the controller 107 has the column CA of the selected area Ex substituted by the redundancy column DA, the column CB of the selected area Ex substituted by the redundancy column DB, and the column CD of the selected area Ex substituted by the redundancy column DC, and it accesses the memory cell array 103.

Similarly, when the selected row address belongs to the area Ex+1, the controller reads the column substituting information Dx+1 from the ROM fuse 105 and sets it in the column substituting register 106. As shown in FIG. 6B, the controller has the column CC of the selected area Ex+1 substituted by the redundancy column DA and the column CD substituted by the redundancy column DC, and it accesses the memory cell array 103.

Here, by substituting not only the global defective columns but also the local defective columns for each of areas E1 to Ep, it is possible to efficiently use the redundancy columns, and it is possible to efficiently save the local defective columns.

Consequently, it is possible to decrease the frequency of generating the defective blocks, and it is possible to decrease the number of necessary surplus blocks. In addition, it is possible to improve the efficiency in saving the columns, and it is possible to increase the yield.

This discussion has focused on the case in which the ECC treatment is carried out for the local defective columns without carrying out the redundancy treatment. However, when the local defective columns are concentrated at a certain site, the ECC treatment becomes impossible, and it is necessary to carry out bad block forming treatment.

However, according to this embodiment, the column selected as a local defective column can be substituted for each of the areas E1 to Ep, and it is possible to decrease the frequency of correction by ECC. As a result, improvement in its performance can be expected. For example, by carrying out area switching, the same redundancy column DA can be adopted for the local defective columns of the column CA of the area Ex and the local defective columns of the column CC in the area Ex+1, and there is no need to allot the redundancy columns individually to each of the columns CA and CC. Consequently, it is possible to increase the saving efficiency.

When the number of the blocks contained in each of areas E1 to Ep decreases, the number of the redundancy columns for areas E1 to Ep decreases, and it is possible to increase the saving efficiency. Here, however, as the number of the blocks contained in each of the areas E1 to Ep decreases, the number of the areas E1 to Ep increases, so that the frequency of area switching increases, and the level of performance decreases. As a result, it is preferred that the number of the blocks contained in the areas E1 to Ep be set so that the saving efficiency and the performance are both guaranteed.

For example, when there is certain margin in the number of the redundancy columns, one may increase the number of the blocks contained in each of the areas E1 to Ep so that the margin can be used up. On the other hand, if the number of the defective columns contained in each of the areas E1 to Ep is large, and there are not enough redundancy columns for substituting all of the defective columns in the areas E1 to Ep, one may also adopt a scheme in which the number of the blocks contained in the areas E1 to Ep is decreased corresponding to the deficiency of the redundancy columns.

(Second Embodiment)

Figure 7:
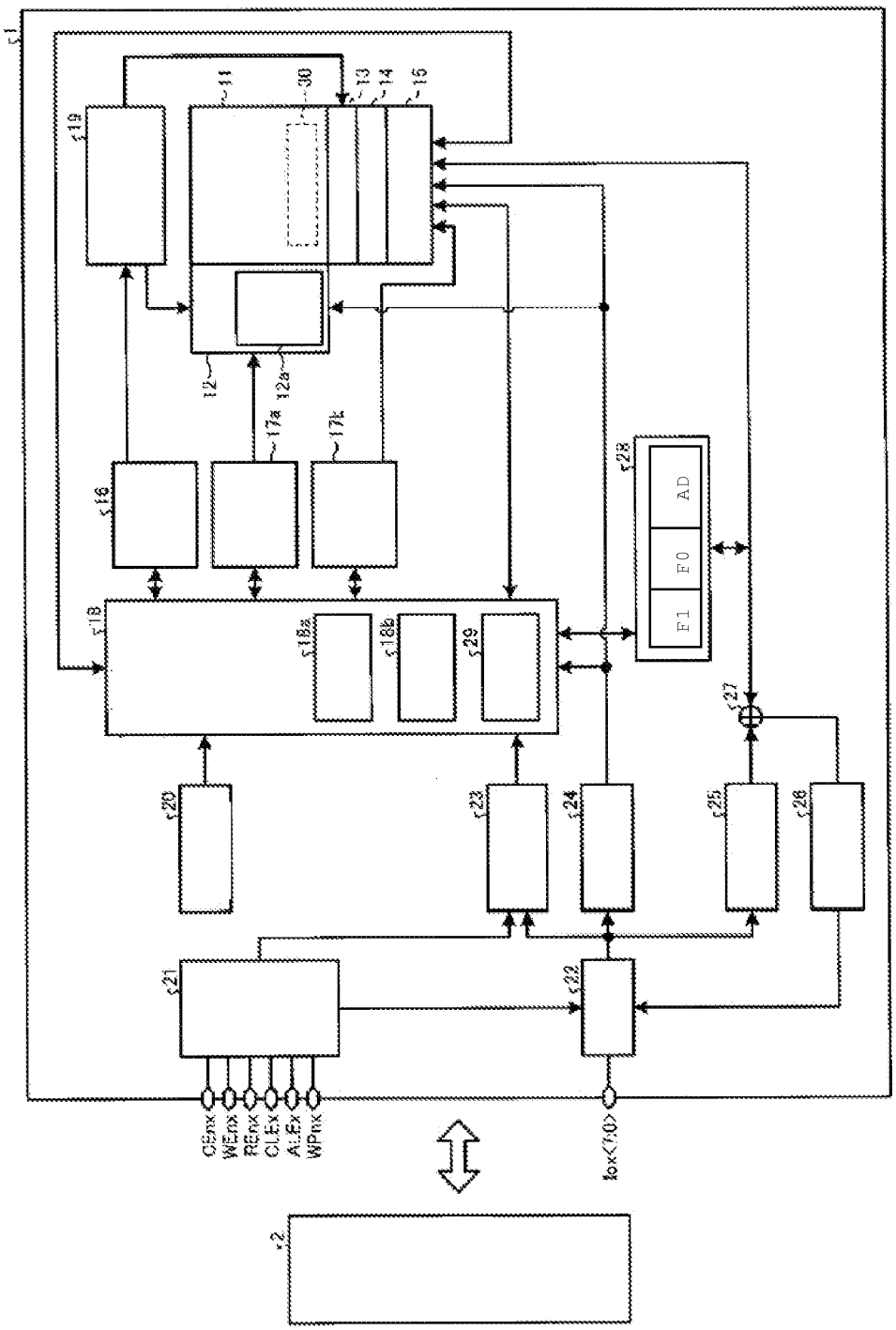
FIG. 7 is a schematic block diagram illustrating the nonvolatile semiconductor memory device according to a second embodiment.

FIG. 7 is a block diagram illustrating schematically the constitution of the nonvolatile semiconductor memory device according to the second embodiment. Here, the nonvolatile semiconductor memory device may be the so-called planar NAND flash memory, a BiCS memory, or another three-dimensional NAND flash memory.

As shown in FIG. 7, just as in FIG. 1, the nonvolatile semiconductor memory device has a NAND flash memory 1 and a controller 2. The drive control for the NAND flash memory 1 includes, e.g., the read control, block select, error correction, and wear leveling for the NAND flash memory 1.

The NAND flash memory 1 has a memory cell array 11, a row decoder 12, a sense amplifier 13, a data cache 14, a write column detector 15, a charge pump controller 16, a row controller 17a, a column controller 17b, a sequence controller 18, a charge pump circuit 19, a power supply detector 20, buffers 21 and 22, a command decoder 23, an address buffer 24, a data buffer 25, an output buffer 26, a multiplexer 27, and a column substituting register 28.

The column substituting register 28 can hold the column substituting information. Here, the column substituting register 28 has flag registers F0 and F1 holding two flags indicating the state of the redundancy column of the selected area and an address register AD holding the substituting origin column address.

The flag register F0 can hold the flag Flag0. Here, the flag Flag0 is an index indicating whether the redundancy column is a defective column. If the redundancy column is a defective column, the flag Flag0 is set at "1". If the redundancy column is not a defective column, the flag Flag0 is set at "0".

The flag register F1 can hold the flag Flag1. Here, the flag Flag1 is an index indicating whether the redundancy column is adopted in substituting the column. If the redundancy column is adopted in substituting the column, the flag Flag1 is set at "1;" and if the redundancy column is not adopted in substituting the column, the flag Flag1 is set at "0."

Here, the column substituting information, the trimming information, and the bad block information of all of the areas can be registered in the ROM fuse 30.

The controller 2 has the following signals input into the buffer 21: the chip enable signal CEnx, the write enable signal WEnx, the read enable signal REnx, the command latch enable signal CLEx, the address latch enable signal ALEx, and the write protect signal WPnx. In addition, the controller 2 has the command, address and write data input via the input/output port IOx<7:0> to the buffer 22. At the same time, the buffer 22 has the read data output via the input/output port IOx<8:1> output to the controller 2.

As the command latch enable signal CLEx is activated, the buffer 22 receives the control of the output of the buffer 21 while it transfers the command to the command decoder 23. Also, as the address latch enable signal ALEx is activated, the buffer 22 receives the control of the output of the buffer 21 while it transfers the address to the address buffer 24. When the write enable signal WEnx is activated, the buffer 22 receives control of the output of the buffer 21 while it transfers the write data to the data buffer 25. Also, when the read enable signal REnx is activated, the buffer 22 receives control of the output of the buffer 21 while it fetches the read data from the output buffer 26 and transfers it to the input/output port IOx<8:1>.

The command decoder 23 construes the command, and, as needed, it determines start of the write, read, erase, or other necessary operation and the internal operation state. Then, it notifies the sequence controller 18 with the instruction signal instructing the initiation of the operations.

The address buffer 24 holds the address of the write, erase or read input via the buffer 22; according to the control from the sequence controller 18, it outputs the row address to the row decoder 12; at the same time, it outputs the column address to the sense amplifier 13. Also, the address buffer 24 can have a counter circuit formed for it and can contain an address comparator contained in it.

The data buffer 25 temporarily holds the write data input via the buffer 22, and it has the data transferred via the multiplexer 27 to the sense amplifier 13.

The output buffer 26 temporarily holds the read data read via the sense amplifier 13 and transfers it to the buffer 22.

Under instruction from the sequence controller 18, the row controller 17a controls the timing of the operation of the row decoder 12. Under instruction from the sequence controller 18, the column controller 17b controls the timing of the operation of the sense amplifier 13, the data cache 14 and the write column detector 15.

Under instruction from the sequence controller 18, the charge pump controller 16 assigns the voltage needed to write, read or erase data, and it outputs the voltage to the charge pump circuit 19.

On the basis of the signal assigned by the charge pump controller 16, the charge pump circuit 19 generates the voltage needed for the read and erase, and it outputs the voltage to the row decoder 12 and the sense amplifier 13.

The sense amplifier 13 detects the potential of the bit line connected to the selected cell, and it determines the read data and outputs it to the data cache 14.

The data cache 14 holds at least one page or more of the plural registers (cache) that temporarily hold the read data and the write data.

On the basis of the result of the execution of the write operation verification, the write column detector 15 can detect completion of the write operation for each column of the memory cells.

The row decoder 12 is arranged for each block, and it carries the selection of the block. The row decoder 12 transfers the voltages needed for the write, read and erase operations to the selected word line of the selected block, and it executes the write, read or erase operation of the memory cell array 11. Here, the bad block flag register 12a that sets the bad block flag is set in the row decoder 12.

Under instruction from the command decoder 23 and according to the contents of the column substituting register 28 and the output of the write column detector 15, the sequence controller 18 controls the read operation, the write operation, the erase operation, and other incorporated test operations of the memory cells. Control of the read operation, the write operation, and the erase operation of the memory cells is carried out by controlling the row decoder 12, the sense amplifier 13, the write column detector 15, and the charge pump circuit 19 via the charge pump controller 16, the row controller 17a, and the column controller 17b. Here, the trimming register 29 holding the trimming information is arranged in the sequence controller 18. Also, a selected area determination section 18a and the area switching instruction section 18b are set in the sequence controller 18. The selected area determination section 18a can determine the selected area of the memory cell array 11 that is accessed on the basis of the assigned address. The area switching instruction section 18b can execute the ROM read and can set the column substituting information corresponding to the selected area in the column substituting register 28 when the area is switched.

Figure 8:
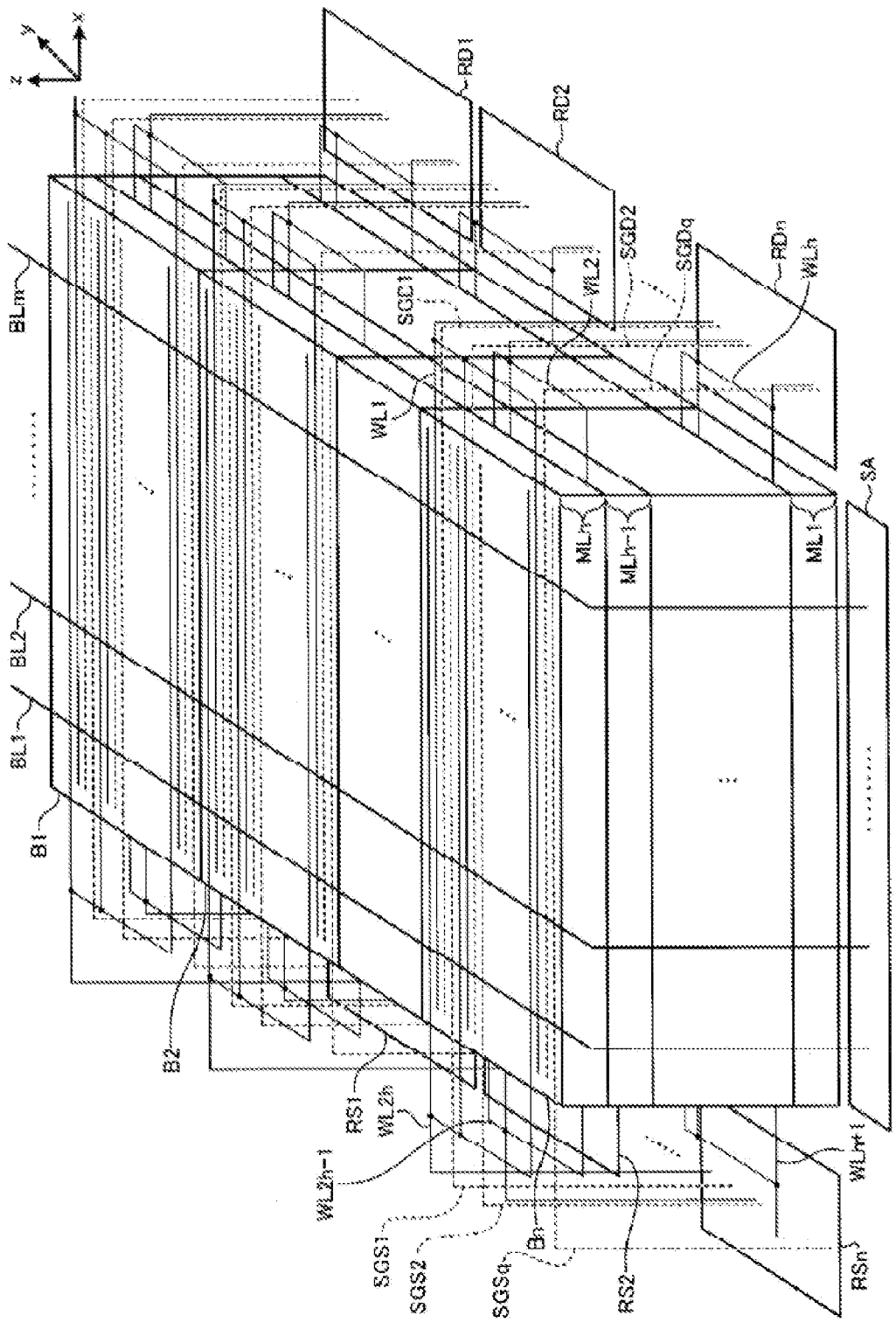
FIG. 8 is a schematic block diagram illustrating the constitution of the memory array shown in FIG. 7.
Figure 9:
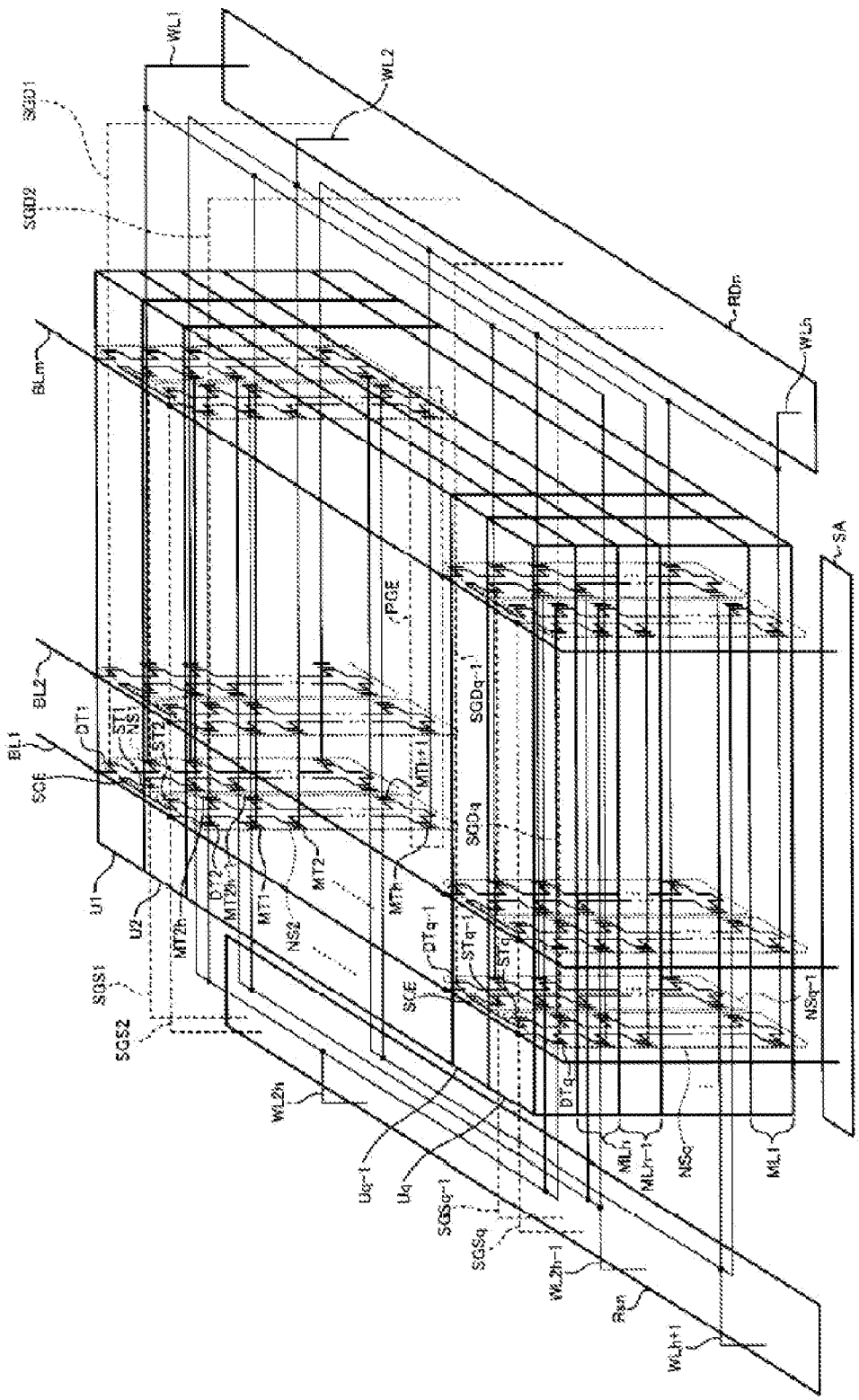
FIG. 9 is a circuit diagram illustrating schematically the block in FIG. 8.
Figure 10:
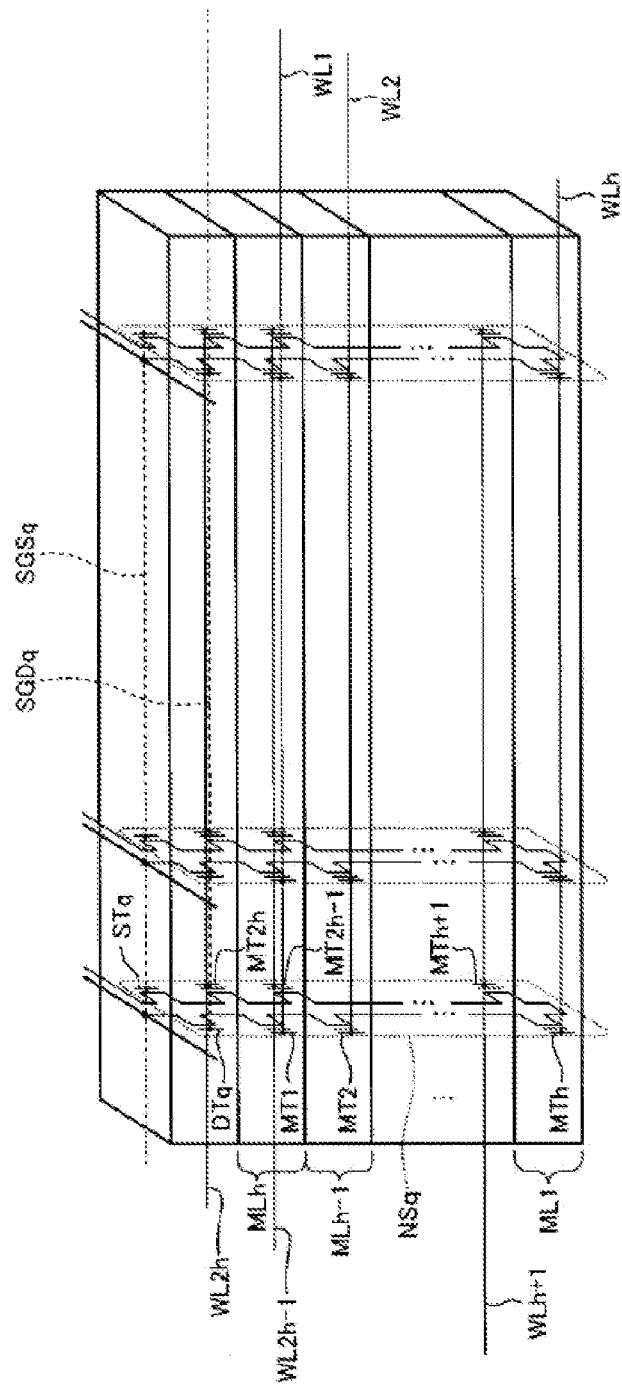
FIG. 10 is an enlarged circuit diagram illustrating schematically the string unit in FIG. 9.

FIG. 8 is a schematic circuit diagram illustrating the constitution of the memory cell array shown in FIG. 7. FIG. 9 is a schematic circuit diagram illustrating the constitution of the block shown in FIG. 8. FIG. 10 is an enlarged perspective view illustrating schematically the constitution of the string unit shown in FIG. 9. Besides, in the examples shown in FIGS. 8 to 10, a 3-dimensional NAND flash memory in which memory cells are arranged in the x, y, z directions in 3-dimension. According to the method in the example shown in FIGS. 8 to 10, the word lines WL1 to WLh and the (drain-side) select gate lines SGD1 to SGDn, as well as the word lines WLh+1 to WL2h and the (source-side) select gate lines SGS1 to SGSn, are led out in directions opposite to each other.

As shown in FIGS. 8 to 10, the memory cell array has a hierarchal structure of blocks→string units→NAND strings.

In the memory cell array, n (n is an integer of 2 or larger) blocks B1 to Bn are arranged in the y-direction. The blocks B1 to Bn have h (h is a positive integer) cell layers ML1 to MLh laminated via the interlayer insulating films (not shown in the figure). In each of the blocks B1 to Bn, q (q is a positive integer) string units U1 to Uq are arranged side by side in the y-direction. In each of the string units U1 to Uq, m (m is a positive integer) NAND strings NS1 to NSm are arranged side by side in the row direction. Each of the NAND strings NS1 to NSm has 2 h (h is a positive integer) cell transistors MT1 to MT2h, select transistors ST, DT arranged on the two ends of the 2 h cell transistors, and back gate transistors arranged between the h cell transistors MT1 to MTh and the h cell transistors MTh+1 to MT2h.

The cell transistors MT1 to MT2h are connected in series sequentially. Here, the cell transistors MT1 to MT2h are arranged in the lifting order from the side of the bit line BL towards the side of the source line SCE. Between the cell transistors MTh and MTh+1, the cell transistors are folded back via the back gate transistors in the column direction (the constitution of the memory cell array will be explained in more detail later).

In each of the blocks B1 to Bn, the word lines WL1 to WL2h, the select gate lines in the drain side SGD1 to SGDq, and the select gate lines in the source side SGS1 to SGSq are arranged side by side in the y-direction; at the same time, the bit lines BL1 to BLm are arranged side by side in the x-direction.

Here, the word lines WL1 to WL2h, the select gate lines SGD1 to SGDq in the drain side, and the select gate lines SGS1 to SGSq in the source side are arranged individually in each of the blocks B1 to Bn. The bit lines BL1 to BLm are shared by the blocks B1 to Bn.

Then, in each of the blocks B1 to Bn, the row decoders RD1 to RDn and RS1 to RSn are arranged. Here, for example, in block Bn, the word lines WL1 to WLh and the select gate lines SGD1 to SGDq in the drain side, as well as the word lines WLh+1 to WL2h and the select gate lines SGS1 to SGSq in the source side, are led out in directions opposite to each other. The row decoder RDn is arranged in the lead-out direction of the word lines WL1 to WLh and the select gate lines SGD1 to SGDq in the drain side. The row decoder RSn is arranged in the lead-out direction of the word lines WLh+1 to WL2h and the select gate lines SGS1 to SGSq in the source side.

Also, the sense amplifier SA is shared by the blocks B1 to Bn. The bit lines BL1 to BLm are connected to the sense amplifier SA.

In each of the blocks B1 to Bn, the select gate lines SGD1 to SGDq in the drain side and the select gate lines SGS1 to SGSq in the source side are arranged individually in each of the string units U1 to Uq.

In each of the blocks B1 to Bn, the word lines WL1 to WLh are commonly connected to the gates of the corresponding cell transistors MT1 to MTh among the different string units U1 to Uq. That is, the word line WL1 is commonly connected to all of the gates of the cell transistors MT1 in the string units U1 to Uq in, e.g., block B1. In, e.g., the block B1, the word line WL2 is commonly connected to all of the gates of the cell transistors MT2 of the string units U1 to Uq. The word lines WL3 to WLh are commonly connected to the gates of the corresponding cell transistors MT3 to MTh just as the word lines WL1 and WL2.

In each of the blocks B1 to Bn, the word lines WLh+1 to WL2h are commonly connected to the gates of the corresponding cell transistors MTh+1 to MT2h among the different string units U1 to Uq.

In each of the blocks B1 to Bn, as compared with the case in which the word lines WL are led out for each of the string units U1 to Uq (comparative example), in the present embodiment, the common connection is carried out to the gates of the corresponding cell transistors MT1 to MTh of the different string units U1 to Uq. Consequently, according to the present embodiment and different from the comparative example, it is possible to decrease the number of lead-out lines from the word lines WL1 to WL2h to 1/q lines. As a result, in contrast to the comparative example, according to the present embodiment, it is possible to suppress the trend of increasing the scale of the row decoders 71 and 72.

By dividing the word lines WL1 to WL2h to the various blocks B1 to Bn, even when the word lines WL1 to WL2h are shared by the plural string units different from each other in the same blocks B1 to Bn, it is still possible to suppress and increase in the load applied when the word lines WL1 to WL2h are turned on.

The back gate line BG is connected to the gate of the back gate transistor.

In each of the string units U1 to Uq, the select transistors DT1 to DTq and ST1 to STq for selecting the string units U1 to Uq are arranged. Here, the cell transistors MT1 of the various NAND strings NS1 to NSq are connected to the bit lines BL1 to BLm via the select transistors DT1 to DTq, respectively. Also, the cell transistors MT2h of the NAND strings NS1 to NSq are connected to the source line SCE via the select transistors DT1 to DTq, respectively.

In addition, the drain-side select gate lines SGD1 to SGDq are connected to the gates of the select transistors DT1 to DTq, respectively, and the select gate lines SGS1 to SGSq in the source side are connected to the gates of the select transistors ST1 to STq, respectively.

Among the cell transistors that share the word lines WL, the plural cell transistors in the common string units U1 to Uq form a page. The page is the unit of writing data in the memory cells, and the unit for reading data from the memory cells.

Figure 11:
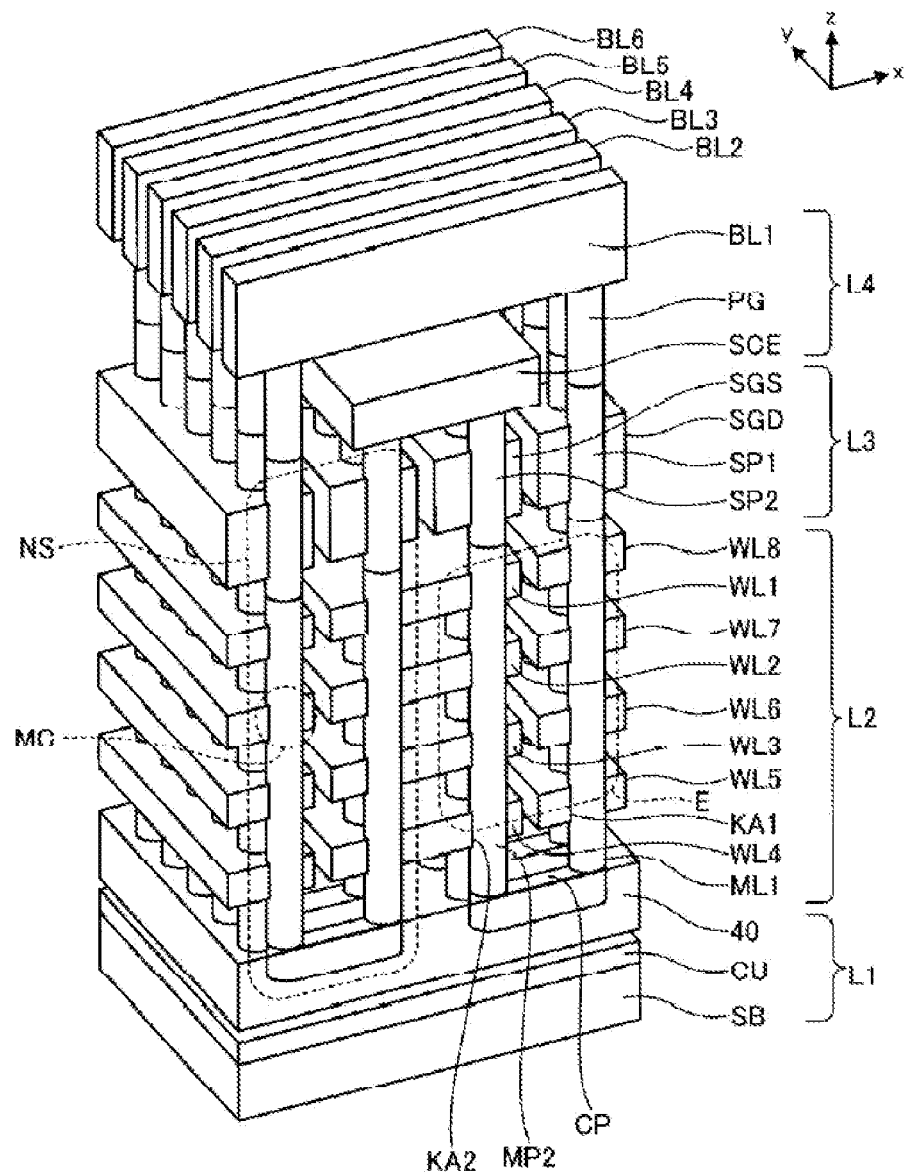
FIG. 11 is a perspective view illustrating the memory cell array of the nonvolatile semiconductor memory device shown in FIG. 7.
Figure 12:
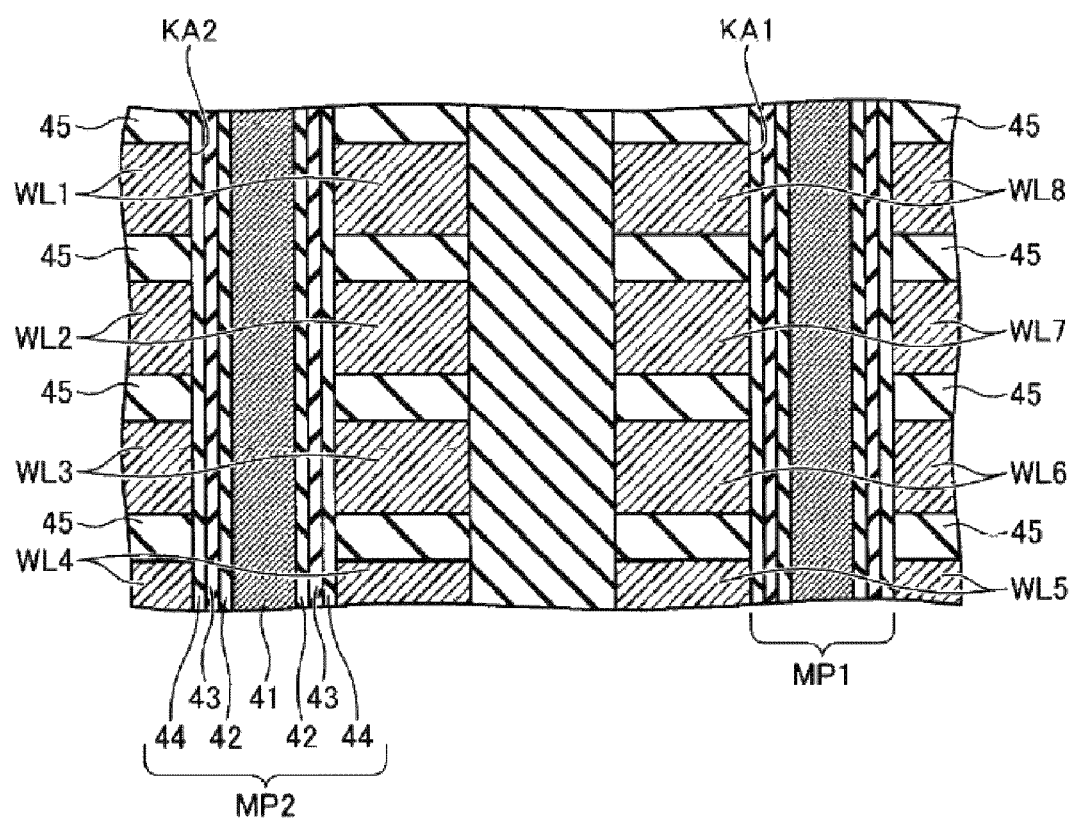
FIG. 12 is an enlarged cross-sectional view illustrating the E-portion in FIG. 11.

FIG. 11 is a schematic perspective view illustrating an example of the constitution of the memory cell array of the nonvolatile semiconductor memory device shown in FIG. 7. FIG. 12 is an enlarged cross-sectional view illustrating the E-portion shown in FIG. 11.

The memory cell array shown in the figure has the circuit region R1 and the memory region R2. The circuit region R1 is formed on the semiconductor substrate SB. The memory region R2 is formed on the circuit region R1.

The memory cell array has the following layers formed sequentially on the semiconductor substrate SB: a circuit layer CU, a back gate transistor layer L1, a cell transistor layer L2, a select transistor layer L3, and a wiring layer L4.

The back gate transistor layer L1 works as the back gate transistor BT. The cell transistor layer L2 works as the cell transistors MT1 to MT8. The select transistor layer L3 works as the select transistors SGD, SGS. The wiring layer L4 works as the source line SL and the bit line BL.

The back gate transistor layer L1 has the back gate electroconductive layer 40. The back gate electroconductive layer 40 is formed two-dimensionally in the x-direction and the y-direction parallel to the semiconductor substrate SB. The back gate electroconductive layer 40 is divided into the blocks B1 to Bn. The back gate electroconductive layer 40 is formed from, e.g., polysilicon. The back gate electroconductive layer works as the back gate line BG.

As shown in FIG. 11, the back gate electroconductive layer 40 has back gate holes. The back gate holes are formed in the back gate electroconductive layer 40. The back gate holes are formed in rectangular shape with the column direction as the longitudinal direction as viewed from the upper surface.

The memory cell transistor layer L2 is formed as the upper layer on the back gate transistor layer L1. The memory cell transistor layer L2 has word line electroconductive layers (also known as word lines) WL1 to WL8. The word line electroconductive layers WL1 to WL8 are laminated with the interlayer insulating layers (not shown in the figure). The word line electroconductive layers WL1 to WL8 are formed in a stripe shape extending in the y-direction with a prescribed pitch in the column direction. The word line electroconductive layers WL1 to WL8 may be formed from polysilicon.

As shown in FIG. 11, the memory cell transistor layer L2 has memory holes KA1 and KA2. The memory holes KA1 and KA2 are formed through the word line electroconductive layers WL1 to WL8. The memory holes KA1 and KA2 are formed in this way are matched near the end portion in the column direction of the back gate holes.

As shown in FIG. 12, the back gate transistor layer L1 and the memory cell transistor layer L2 work as the block insulating layer 44, the charge storage layer 43, the tunnel insulating layer 42, and the semiconductor layer 41. The semiconductor layer 41 works as the body of the NAND string (the back gate of each transistor).

As shown in FIG. 12, the block insulating layer 44 is formed with a prescribed thickness on the side wall facing the back gate holes and the memory holes KA1 and KA2. The charge storage layer 43 is formed with a prescribed thickness on the side surface of the block insulating layer 44. The tunnel insulating layer 42 is formed with a prescribed thickness on the side surface of the charge storage layer 43. The semiconductor layer 41 is formed in contact with the side surface of the tunnel insulating layer 42. The semiconductor layer 41 is formed to bury the back gate holes and the memory holes KA1 and KA2.

The semiconductor layer 41 is formed in U shape as viewed in the Y-direction. That is, the semiconductor layer 41 has a pair of pillar shaped portions MP1 and MP2 extending in the vertical direction perpendicular to the surface of the semiconductor substrate SB and a connecting portion that connects the lower ends of the pair of pillar-shaped portions MP1 and MP2.

The block insulating layer 44 and the tunnel insulating layer 42 may be made of silicon oxide ($SiO_2$). For example, the charge storage layer 43 may be made of silicon nitride (SiN). The semiconductor layer 41 is made of polysilicon. The block insulating layer 44, charge storage layer 43, tunnel insulating layer 42, and semiconductor layer 41 form the MONOS-type transistor that works as the memory transistor MT.

In other words, as far as the constitution of the back gate transistor layer L1 is concerned, the tunnel insulating layer 42 is formed to surround the connecting portion. The back gate electroconductive layer 40 is also formed to surround the connecting portion.

As far as the constitution of the memory transistor layer L2 is concerned, the tunnel insulating layer 42 is formed to surround the pillar-shaped portions MP1 and MP2. The charge storage layer 43 is formed to surround the tunnel insulating layer 42. The block insulating layer 44 is formed to surround the charge storage layer 43. The word line electroconductive layers WL1 to WL8 are formed to surround the block insulating layer 44.

As shown in FIG. 11, the select transistor layer L3 has electroconductive layers (also known as select gate lines) SGS and SGD. The electroconductive layers SGS and SGD are formed in a stripe shape extending in the y-direction with a prescribed pitch in the column direction. A pair of electroconductive layer SGS and a pair of electroconductive layer SGD are arranged alternately in the X-direction. The electroconductive layer SGS are formed as the upper layer of one pillar-shaped portion MP2, and the electroconductive layer SGD are formed as the upper layer of the other pillar-shaped portion MP1. The electroconductive layers SGS and SGD are formed from the polysilicon.

As shown in FIG. 12, the select transistor layer L3 has holes SP1 and SP2. The holes SP1 and SP2 go through the electroconductive layers SGS and SGD, respectively. Here, the holes SP1 and SP2 are matched with the memory holes MP1 and MP2.

The select transistor layer L3 has a gate insulating layer and a semiconductor layer. The gate insulating layer is formed on the side wall facing the holes. The semiconductor layer is formed in pillar shape extending in the vertical direction perpendicular to the surface of the semiconductor substrate SB so that it is in contact with the gate insulating layer.

The gate insulating layer is formed from, e.g., silicon oxide ($SiO_2$). The semiconductor layer is formed from, e.g., polysilicon.

As shown in FIG. 11, the wiring layer L4 is formed as the upper layer above the select transistor layer L3. The wiring layer L4 has a source line layer (also known as source line) SCE, a plug layer PG, and bit line layers (also known as bit lines) BL1 to BL6.

The source line layer SCE is formed in a sheet-like shape extending in the row direction. The source line layer SCE is formed so that it is in contact with the upper surface of the pair of holes SP2 adjacent each other in the column direction. The plug layer PG is in contact with the upper surface of the electroconductive layer portions SGD, and it is formed extending in the direction perpendicular to the surface of the semiconductor substrate SB. The bit lines BL1 to BL6 are formed in a stripe shape extending in the X-direction with a prescribed pitch in the Y-direction. The bit line layers BL1 to BL are formed in contact with the upper surface of the plug layer PG. The source line layer SCE, the plug layer PG, and the bit line layer portions BL1 to BL6 are formed from, e.g., tungsten (W) or other metal.

Structure of the memory cell array 103 is not limited as above description. A memory cell array formation may be disclosed in U.S. patent application Ser. No. 12/532,030. U.S. patent application Ser. No. 12/532,030, the entire contents of which are incorporated by reference herein.

In the following, the write operation, the read operation and the erase operation of the nonvolatile semiconductor memory device in this embodiment will be explained with reference to FIG. 9.

(1) Write Operation

In order to facilitate the explanation, for example, it is assumed that data are written in a page unit in the plural cell transistors MT connected to the word line WL1 shown in FIG. 9. Here, the explanation will focus on the example in which data are written in the plural cell transistors MT1 of the NAND strings NS1 to NSq in the string unit U1. More specifically, in the example to be explained, data "0" is written in the cell transistor MT1 of the NAND strings NS1, and data "1" is written in the cell transistor MT1 of each of the NAND strings NS2 to NSm (in the case of writing binary data).

In the write operation, the controller has the program voltage Vpp applied on the selected word line WL1, and an intermediate voltage Vpass (e.g., 10 V) is applied on the non-selected word lines WL2 to WLh+1.

In addition, the write voltage (e.g., 0 V) is applied on the bit line BL1, and a write-inhibiting voltage (such as 2.5 V) is applied on the remaining bit lines BL2 to BLm. The desired voltage is applied on the select gate lines SGD and SGD of the string unit U1 so that the select transistor DT is turned on, while a low voltage (e.g., 0 V) is applied on the select gate lines SGD and SGS of the other string units U2 to Uq so that the select transistor DT is turned off.

As a result, data "0" can be written in the cell transistor MT1 of the NAND strings NS1, and data "1" can be written in the cell transistor MT1 of each of the NAND strings NS2 to NSm.

(2) Read Operation

Just as in (1), in order to facilitate the explanation, it is assumed that data are read from plural cell transistors MT1 of the string unit U1.

In the read operation, just as in (1), the controller controls the select transistor DT to select the string unit U1.

The precharge voltage is applied on the bit lines BL1 to BLm, and 0 V is applied on the source line SCE.

The read voltage (e.g., 0 V) is applied on the word line WL1 connected to the cell transistor MT1 as the read subject, and an intermediate voltage VREAD (e.g., 10 V) is applied on the remaining word lines WL2 to WLh+1.

For the cell transistor MT that holds data "0," the potential of the bit line BL is kept, and, for the cell transistor MT that holds data "1," the potential of the bit line BL is discharged. By judging the potential of the bit line BL, the threshold of the cell transistor MT1 is read, and it is determined whether the threshold reaches the read level so that the data of the selected page are read.

(3) Erase Operation

For the erase operation, the explanation focuses on the example wherein the data of all of the cell transistors of the block Bn are erased en bloc. In this case, 0 V is applied on the word lines WL1 to WL2h. The erase voltage Ve (e.g., 20 V) is set at the bit lines BL1 to BLm and the source line SCE. Also, a voltage (e.g., 12 V) lower than the erase voltage Ve is set at the select gate lines SGD1 to SGDq and SGS1 to SGSn of the block Bn.

In this case, the depletion layer near the drains of the select transistors DT1 to DTq and ST1 to STq is curved, and a high electric field is applied there. Consequently, an inter-band tunnel current flows in the depletion layer, and the hole/electron pairs are generated. As a result, a GIDL (Gate Induced Drain Leak) current flows near the gate end of the select transistors DT1 to DTq and ST1 to STq, and the holes generated in this case flow to the pillar-shaped semiconductor 41 of the NAND strings NS1 to NSm of the block Bn. As a result, the hole generated by GIDL is inserted into the charge storage layer 43 of the cell transistors MT1 to MT2h of the block Bn, and the erase operation of the memory cells of the block Bn is executed.

In the following, the saving operation of the defective column in the present embodiment will be explained. For example, as shown in FIG. 5, in the die sort test, the column substituting information pieces D1 to Dp for all of the areas E1 to Ep are registered in the ROM fuse 30.

In the power-on state, the sequence controller 16 that has the initial column substituting information (such as D1) is read and set in the column substituting register 28 from the ROM fuse 30 to the data cache 14.

In the case of accessing the memory cell array 11 (for the read operation, the write operation, etc.), when the block address is assigned, the selected area determination section 18a determines to which of the areas E1 to Ep the block address belongs. Then, when the selected area determination section 18a determines that the block address belongs to the area Ex, the sequence controller 16 reads the column substituting information Dx of the area Ex from the ROM fuse 30, sets the column substituting information Dx in the column substituting register 28, and takes the column substituting information Dx as reference, so that it is possible to substitute the column registered as the defective column with the redundancy column.

That is, for example, in the read operation, the memory cell array 11 is accessed in page units, so that the sequence controller 16 makes substitution for each column address of the page by taking the column substituting information Dx as a reference.

When the column address registered as the defective column is accessed, the sequence controller 16 accesses the redundancy column as the substituting destination on the basis of the column substituting information Dx.

When an area, e.g., the area Ex+1, that is different from the area Ex is assigned by the input block address, similarly, the sequence controller 16 reads the column substituting information Ex+1 from the ROM fuse 30 via the data cache 14, and this column substituting information Ex+1 is taken as reference to control access to the memory cell array 11.

Figure 13:
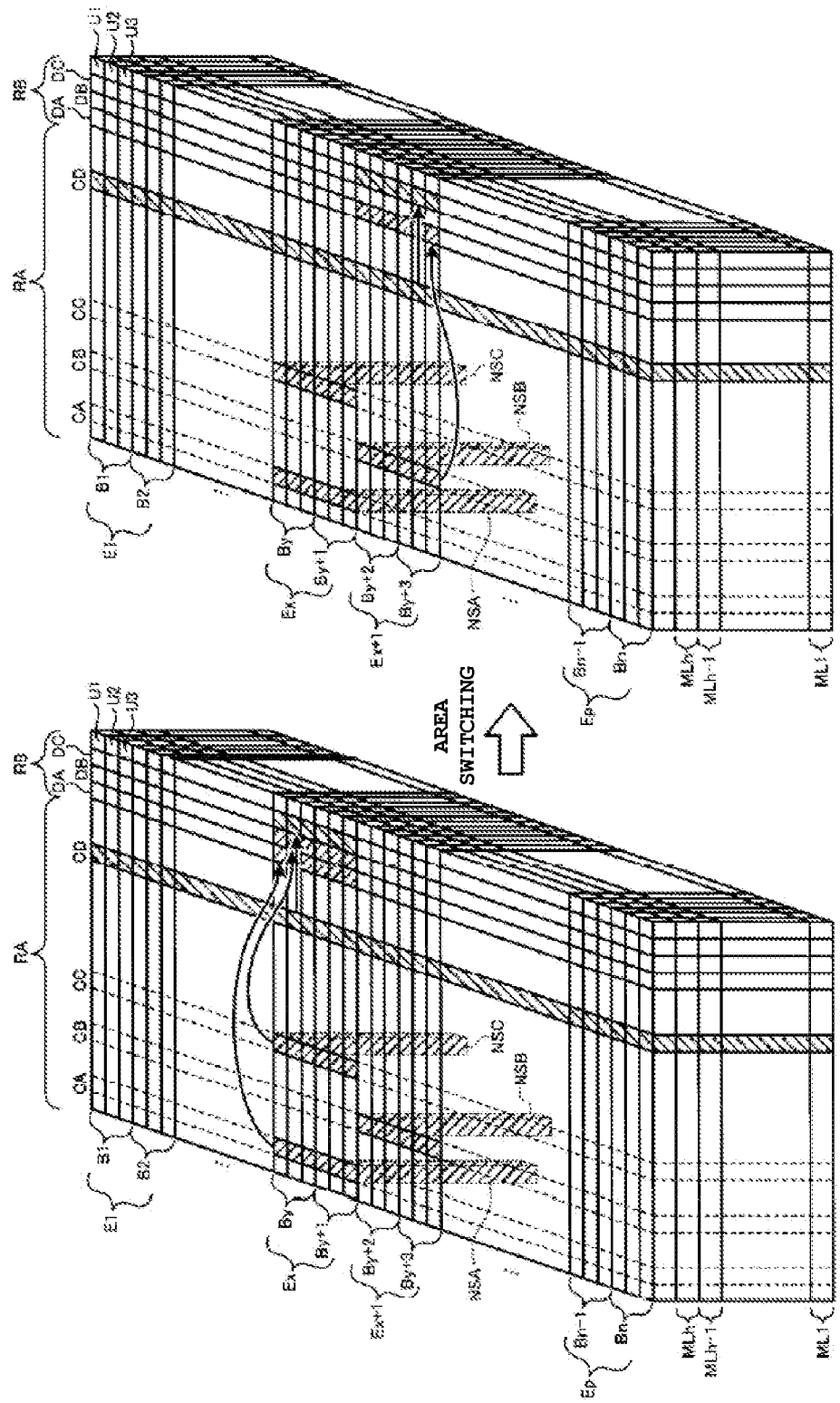
FIG. 13A is a schematic diagram illustrating an example of the column substituting method before area switch of the memory cell array shown in FIG. 8.
FIG. 13B is a schematic diagram illustrating an example of the column substituting method after area switch of the memory cell array shown in FIG. 8.

FIG. 13A is a block diagram illustrating an example of the column substituting method before the area switch of the memory cell array shown in FIG. 8. FIG. 13B is a block diagram illustrating an example of the column substituting method after area switch of the memory cell array shown in FIG. 8. In order to facilitate the explanation, the discussion will focus on the column substituting method when the areas Ex and Ex+1 are selected. In addition, FIGS. 13A and 13B illustrate as an example the case in which the 3 string units U1 to U3 are contained in the blocks B1 to Bn, and 2 blocks are contained in each of the areas E1 to Eq.

As shown in FIG. 13A, suppose there is a defective column in the area Ex in the columns CA, CC, and CD, and there is defective column in the area Ex+1 in the columns CB and CD. In this case, the following information is registered in the column substituting information Dx: the columns CA, CC, and CD are defective columns, and the column CA is substituted by the redundancy column DA, the column CC in the area Ex is substituted by the redundancy column DB, and the column CD in the area Ex is substituted by the redundancy column DC. In addition, the following information is registered in the column substituting information Dx+1: the columns CB and CD are defective columns, the column CB of the area Ex+1 is substituted by the redundancy column DA, and the column CD in the area Ex+1 is substituted by the redundancy column DC.

In this case, even when the defect of the column CA in the area Ex is made of the opening defect of 1 NAND string NSA of the block By+1, and there is no defect in the column CA of the block By in the area Ex, the columns CA of the two blocks By and By+1 in the area Ex are substituted en bloc by the redundancy column DA.

Also, even when the defect of the column CC in the area Ex is made of the opening defect of the NAND string NSC of the block By, and there is no defect in the column CC of the block By+1 in the area Ex, the columns CC of the two blocks By and By+1 in the area Ex are substituted en bloc by the redundancy column DC.

Also, even when the defect of the column CB in the area Ex+1 is made of the opening defect of the NAND string NSB of the block By+2, and there is no defect in the column CB of the block By+3 in the area Ex+1, the columns CB of the two blocks By+2 and By+3 in the area Ex+1 are substituted en bloc by the redundancy column DA.

When the input block address belongs to the area Ex, the column substituting information Dx of the selected area Ex is read from the ROM fuse 30, and it is set in the column substituting register 28. Then, as shown in FIG. 13A, the column CA of the selected area Ex is substituted by the redundancy column DA, the column CC of the selected area Ex is substituted by the redundancy column DB, and the column CD of the selected area Ex is substituted by the redundancy column DC.

On the other hand, when the block address belongs to the area Ex+1, the column substituting information Dx+1 of the selected area Ex+1 is read from the ROM fuse 30, and it is set in the column substituting register 28. Then, as shown in FIG. 13B, the column CB of the selected area Ex+1 is substituted by the redundancy column DA, and the column CD of the selected area Ex+1 is substituted by the redundancy column DC.

In the laminated structure of the memory cells MC shown in FIG. 11, it is hard to guarantee the property of extraction of the memory holes (through holes KA1, KA2), and, when a defect takes place in the memory holes, it is necessary to deem all of the memory cells connected to the corresponding string as defective.

However, according to this embodiment, by saving the local defective columns in each of the areas E1 to Ep, there is no need to take all of the local defective columns as the bad block, and it is possible to efficiently make use of the memory capacity.

According to this embodiment, by carrying out the area switching, it is possible to use the same redundancy column DA for the local defective columns of the column CA in the area Ex and the local defective columns of the column CB in the area Ex+1. Consequently, there is no need to allot the redundancy columns to the columns CA and CB, and it is possible to efficiently use the areas of the column redundancy. As a result, it is possible to increase the saving efficiency.

In addition, as the number of the blocks B1 to Bn contained in each of areas E1 to Ep is decreased, and the number of the redundancy columns adopted for each of areas E1 to Ep is decreased, so that the amount of the column redundancy available for each block increases for each of areas E1 to Ep; thus, the saving efficiency becomes higher.

However, when the number of the blocks B1 to Bn contained in each of areas E1 to Ep is decreased, since the number of areas E1 to Ep increases, so that the number of the switching of the areas increases for each of areas E1 to Ep, and thus the performance becomes lower.

In consideration of this, it is preferred that the number of the blocks B1 to Bn contained in each of areas E1 to Ep be set to ensure both high saving efficiency and good performance.

For example, when there is margin in the number of the redundancy columns, one may increase the number of the blocks B1 to Bn contained in each of areas E1 to Ep so that the margin is used up. On the chance that the number of the defective columns contained in each of areas E1 to Ep is large and there are no sufficient redundancy columns that can substitute all of the defective columns in each of areas E1 to Ep, one may also adopt a scheme in which the number of the blocks B1 to Bn contained in each of areas E1 to Ep is decreased corresponding to the deficiency of the redundancy columns. For example, when each of the areas E1 to Ep is composed of block B, it is possible to save the column defects corresponding to the number of the column redundancy for each of areas E1 to Ep.

Also, if column defects of different columns are concentrated in a certain area, when switching is made for the area, the redundancy columns for saving the column defect may be insufficient. In consideration of this state, one may also adopt a scheme in which the blocks B1 to Bn belonging to the various areas are set so that the column defects of different columns are evenly allotted to the various areas and so that there is no concentration of the column defects of different columns in a certain area.

Also, when the column defects of different columns are concentrated in a certain area, and the redundancy columns available for saving such column defects are insufficient, one may also adopt a scheme in which a portion of the blocks B1 to Bn with column defects in the area are converted to a bad block until there is no more deficiency in the column redundancy; then, it has the defective columns of the area substituted by the redundancy columns.

Figure 14:
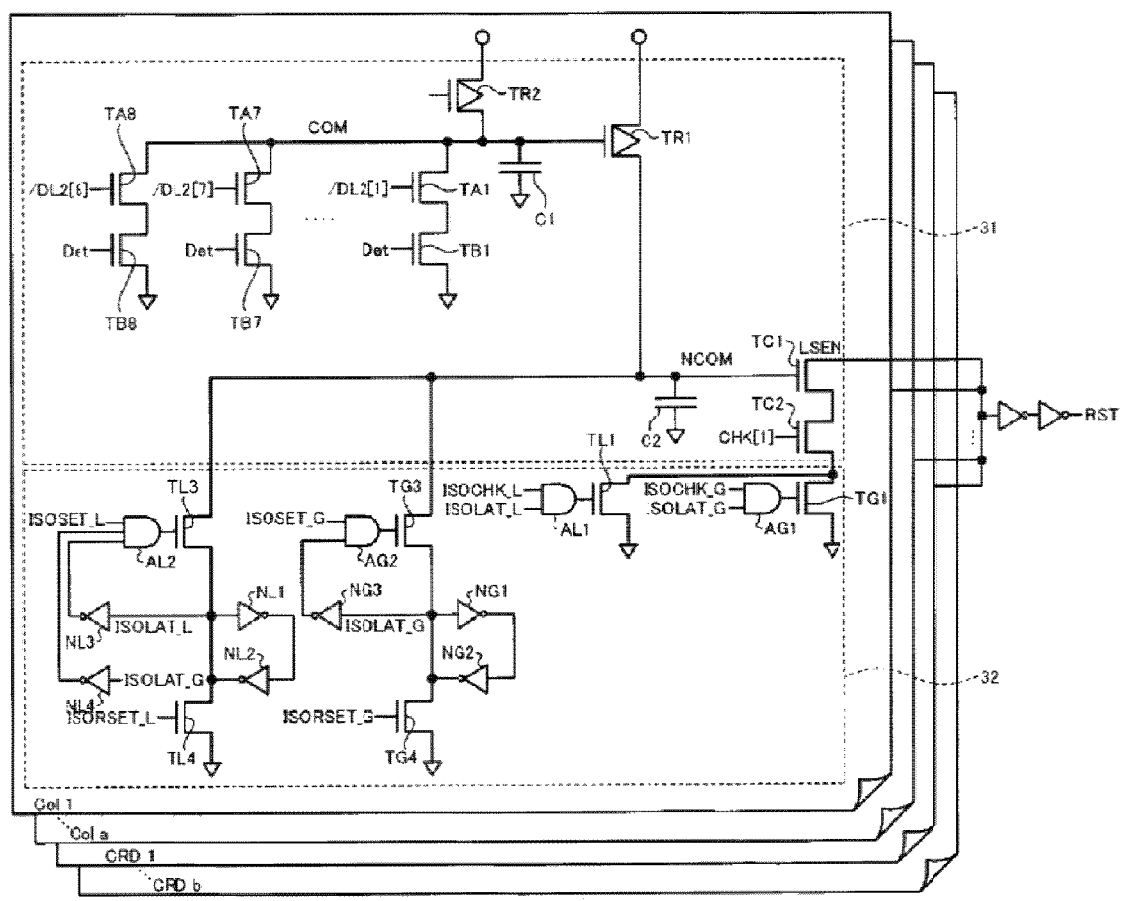
FIG. 14 is a circuit diagram illustrating schematically the constitution of the write column detector circuit 15 in FIG. 7.

FIG. 14 is a circuit diagram illustrating schematically the constitution of the write column detector 15 shown in FIG. 7.

As shown in FIG. 14, the write column detector 15 has plural column write detecting sections 31 and plural write detection control sections 32. The column write detecting sections 31 and the write detection control sections 32 are arranged in the various columns, respectively. As another example shown in FIG. 13, there are (a+b) column write detecting sections 31, write detection control sections 32 for use in the columns col1 to cola (a is a positive integer), and the redundancy columns CRD1 to CRDb (b is a positive integer).

The column write detecting sections 31 each have the function of detecting the completion of the write operation in each column of memory cell transistors MT for each corresponding column (e.g., 1 byte).

The write detection control sections 32 control the column write detecting sections 31 by setting the state of completion of the write operation independent of the result of the verify operation for the defective columns registered in the global isolation latch ISOLAT_G (to be explained in detail later) and a local isolation latch ISOLAT_L (explained in detail later).

Each of the column write detecting sections 31 has transistors TR1, TR2, TA1 to TA8, TB1 to TB8, TC1, and TC2 and capacitors C1 and C2 arranged in it. Each of the write detection control sections 32 has transistors TL1, TL3, TL4, TG1, TG3, and TG4, inverters NG1 to NG3, NL1 to NL4, and AND circuits AG1, AG2, AL1, and AL2 arranged in it.

Here, the inverters NL1 and NL2 can form the local isolation latch ISOLAT_L. The inverters NG1 and NG2 can form the global isolation latch ISOLAT_G.

The transistors TR1 and TR2 may be made of P-channel field effect transistors, and transistors TA1 to TA8, TB1 to TB8, TC1, TC2, TL1, TL3, TL4, TG1, TG3, and TG4 may be made of N-channel field effect transistors.

Here, the transistors TA1 to TA8 and the transistors TB1 to TB8 each are connected in series, and these serial circuits are connected in parallel with the capacitor C1. Then, the parallel circuit is connected in series with the transistor TR2, and their connecting point is connected to the gate of the transistor TR1.

The data latch inverted signal /DL2 [8:1] obtained by inverting the data latch DL2 [8:1] is input into the gates of the transistors TA1 to TA8, and the verify detection signal Det is input to the gates of the transistors TB1 to TB8. In the verify operation, the data latch DL2 [8:1] can be used as a register for storing the verify result. If the verify result of the data latch DL2 [8:1] is pass, an "H" level is output; if the result is fail, an "L" level is output.

The transistors TC1, TC2 are connected in series, and the gate of the transistor TC1 is connected to the drain of the transistor TR1 and the capacitor C2. The verify determination signals CHK [1:a] and CHK [CRD1:CRDb] at the columns col1 to cola and the redundancy columns CRD1 to CRDb are input to the gate of the transistor TC2. According to the verify determination signal CHK, the write column detector 15 can control for each byte.

The inverters NL1 and NL2 have one input of each of them connected to the other input of the other inverter, at the same time, the output of the inverter NL2 is connected to the gate of the transistor TC1 via the transistor TL3, and the output of the inverter NL2 is connected to the ground via the transistor TL4.

The output of the AND circuit AL2 is connected to the gate of the transistor TL3. The AND circuit AL2 has a constitution with 3 inputs. Input into the AND circuit AL2 are the value of the local isolation set signal ISOSET_L, the value of the local isolation latch ISOLAT_L, and the value of the global isolation latch ISOLAT_G.

The inverters NG1 and NG2 have one input of each of them connected to the other input of the other inverter, and, at the same time, the output of the inverter NG2 is connected to the gate of the transistor TC1 via the transistor TG3 and the output of the inverter NG2 is connected to the ground via the transistor TG4.

The output of the AND circuit AG2 is connected to the gate of the transistor TG3. The AND circuit AG2 has a constitution with 2 inputs. Input to the AND circuit AG2 are the value of the global isolation set signal ISOSET_G and the global isolation latch ISOLAT_G.

The drain of the transistor TL1 is connected to the source of the transistor TC2. The output of the AND circuit AL1 is connected to the gate of the transistor TL1. The AND circuit AL1 has 2 inputs in its constitution. Input to the AND circuit AL1 are the value of the local isolation determination signal ISOCHK_L and the value of the local isolation latch ISO-LAT_L.

The drain of the transistor TG1 is connected to the source of the transistor TC2. The output of the AND circuit AG1 is connected to the gate of the transistor TG1. The AND circuit AG1 has 2 inputs in its constitution. Input to the AND circuit AG1 are the value of the global isolation determination signal ISOCHK_G and the value of the global isolation latch ISO-LAT_G.

Figure 15:
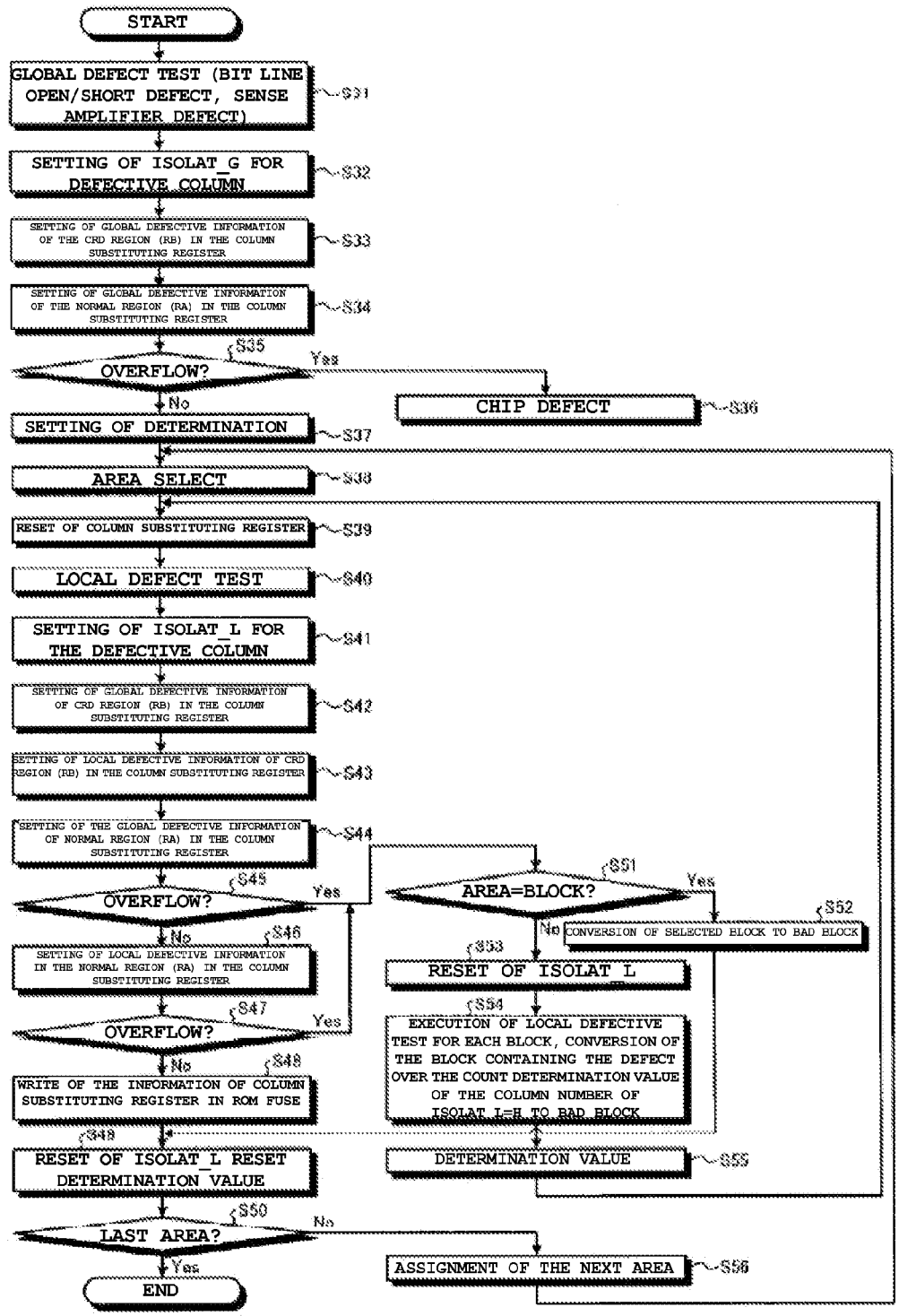
FIG. 15 is a flow chart illustrating the method for setting the column substituting information in the column substituting register in the nonvolatile semiconductor memory device shown in FIG. 7.

In the following, the method for setting the column substituting information in the column substituting register for the nonvolatile semiconductor memory device of the present invention will be explained with reference to FIG. 14, a circuit diagram, FIG. 15, a flow chart, and FIGS. 16A to 16D.

In order to facilitate explanation, the initial state of the write column detector 15 is described as follows.

The local isolation set signal ISOSET_L, the global isolation set signal ISOSET_G, the local isolation reset signal ISORSET_L, the global isolation reset signal ISORSET_G, the global isolation determination signal ISOCHK_G, the local isolation determination signal ISOCHK_L, and the verify determination signal CHK [(a+b):1] are on the "L" level.

(S31) Global defect test is carried out.

For example, a test is carried out to detect the defects of open of bit line BL, the short circuit of bit line, the defect of sense amplifier, and other global defective columns.

(S32) For the defective column, the global isolation latch ISOLAT_G is set.

In the following, a more detailed explanation will be presented.

The node COM of the column write detecting sections 31 is charged, and the verify detection signal Det is set on the "H" level by the sequence controller 16. Then, the gates of the transistors TA1 to TA8 of the column write detecting section 31 receive the results of the global defect test of the corresponding column. That is, the results of the global defect tests are input into the column write detecting sections 31 of all of the columns, respectively. For example, suppose there is an open defect in the bit line BL1, the "H" level is input to the gate of the transistor TA1 corresponding to the bit line BL1, while the "L" level is input to the gates of the other transistors TA2 to TA8.

As a result, when, e.g., an open defect takes place in at least one of the columns, the corresponding transistor TA is turned on, and the potential of the node COM is discharged.

As the node COM is discharged, the transistor TR1 is turned on, and the node NCOM is charged.

Here, the global isolation reset signal ISORSET_G is set at the "H" level, and the global isolation latch ISOLAT_G is set at the "L" level. Then, the global isolation set signal ISOSET_G is set at the "H" level, the "H" level of the node NCOM is transferred to the global isolation latch ISOLAT_G, and it is set there. That is, suppose an open defect takes place in at least one bit line among the columns, the global isolation latch ISOLAT_G is kept at the "H" level; when there is no defect, the global isolation latch ISOLAT_G is kept at the "L" level even after reset.

The column write detecting sections 31 and the write detection control sections 32 carry out the same operation for each column so that, after step S32, the results of the global defect test are registered in the global isolation latches ISO-LAT_G of all of the columns.

In the following, a brief account will be presented in the case when there are plural types of tests (the first test, the second test, etc.) used as the global defect test. First, the result of the first test is transferred to the global isolation latch ISOLAT_G. When there is defect in certain bit line of the column, the global isolation latch ISOLAT_G is kept at the "H" level. In this case, the transistor TG3 is turned off. On the other hand, when there is no defect in the bit lines of the column, the global isolation latch ISOLAT_G is kept at the "L" level. In this case, the transistor TG3 is turned on. Consequently, only when there is no defect in any bit line of the column according to the first test, can the result of the second test be transferred.

That is, when there are plural tests, the results of the plural tests are superposed and held. After the end of the global defect test, only when there is no defect in the column in any test, the global isolation latch ISOLAT_G is kept at the "L" level. When there is a defect in the column according in any test, the global isolation latch ISOLAT_G is held at the "H" level.

(S33) The global defective column information of the column redundancy area RB is set in the column substituting register.

In the following example, the columns CRD1 to CRDb corresponding to the column redundancy area RB are sequentially selected and are set in the column substituting register. In order to facilitate the explanation, as an example, discussion will focus on the case in which the columns CRD1 and CRD2 are sequentially selected and the global defective column information is set in the column substituting register. For the columns CRD3 to CRDb, the same method as that adopted in selecting the column CRD1 and setting the global defective column information is adopted.

After charging of the LSEN, the same method as that adopted in S32 (certain transistor TA is turned on) is adopted to charge the node NCOM. Also, all of the transistors TA can be turned on.

The controller issues to the NAND flash memory 1 the command that selects the column CRD1 and sets the global defective column information. As a result, the column CRD1 is selected via the address buffer 24 and turns on the transistor TC2 of the corresponding column write detecting section 31. The sequence controller 18 operates so that the global isolation determination signal ISOCHK_G becomes the "H" level for all of the columns.

As a result, when the column CRD1 is a global defective column, (when the global isolation latch ISOLAT_G holds the "H" level), the potential of the node LSEN is discharged, and the RST signal on the "L" level is input into the sequence controller 18. When the column CRD1 is a global defective column, the sequence controller 18 accesses the column substituting register 28, and the data "1" is registered at the flag register Flag0 corresponding to the column CRD1.

Then, the sequence controller 18 increments the column selection, and it outputs the signal for selecting the column CRD2 to the write column detector 15. In this case, the node LSEN is charged again, and charging is carried out each time when the column is incremented.

According to this signal, the transistor TC2 corresponding to the column CRD1 is turned on. As a result, when the column CRD2 is a global defective column, the potential of the node LSEN is discharged, and the RST signal on the "L" level is input to the sequence controller 18. When the column CRD2 is a global defective column, the sequence controller 18 accesses to the column substituting register 28, and the data "1" is registered in the flag register Flag0 corresponding to the column CRD2.

By repeating the series of operations, the global defective column information of the column redundancy area RB is set in the column substituting register.

(S34) The global defective column information of the normal area RA is set in the column substituting register.

The operation of this step of operation is the same as that in S33, and it will not be explained in detail again. Here, the controller 12 issues to the NAND flash memory 1a command that selects the column Col1 and sets the global defective column information. The column Col1 is selected via the address buffer 24, and the transistor TC2 of the corresponding column write detecting section 31 is turned on. The sequence controller 18 operates so that the global isolation determination signal ISOCHK_G of all of the columns becomes the "H" level. As a result, when the column Col1 is a global defective column, the potential of the node LSEN is discharged, and the RST signal on the "L" level is input to the sequence controller 18. When the column Col1 is a global defective column, the sequence controller 18 accesses the column substituting register 28 and extracts the redundancy column where the flag register Flag0 has the data "0;" the flag register Flag1 also has the data "0." The sequence controller 18 uploads the data "1" to Flag1 with respect to the redundancy column where the Flag1 has data "0," and it registers the substituting origin column address of the column Col1.

Then, the sequence controller 18 increments the column selection and outputs the signal that sequentially selects the columns Col1 to Cola to the write column detector 15. The sequence controller 18 determines whether the column is a global defective column for each of the columns Col1 to Cola. When the column is found to be a global defective column (when the RST signal on the "L" level is input), the sequence controller 18 accesses the column substituting register 28, and extracts the redundancy column where the Flag0 has data "0;" and the Flag1 also has data "0". The sequence controller 18 uploads the data "1" to Flag1 with respect to the redundancy column where the Flag0 has data "0;" the Flag1 also has data "0," and it registers the substituting origin column address of the columns Col1 to Cola as the global defective column.

The sequence controller 18 repeatedly carries out the substitution, and, when there is no redundancy column where the Flag0 has data "0," and when the Flag1 also has data "0", it holds the fail information in a status register not shown in the figure. Here, the status register is an index indicating whether it is chip defect.

By the series of the steps of operation (S31) to (S34), for example, when the redundancy column CRD2 is a global defective column, the flag Flag1 corresponding to the redundancy column CRD2 is set at "1". When the column Col100 is a global defective column, and this column Col100 is substituted for the redundancy column CRD1, the flag Flag0 corresponding to the redundancy column CRD1 is set at "1," and 100 is registered in the address register AD that holds the substituting origin column address.

(S35) Then, the sequence controller 18 determines whether the number of the global defective columns set in the column substituting register is over the number of the redundancy columns (S35). This can be determined by taking the status register as reference.

In the case of overflow, the sequence controller 18 takes it as a defect of the semiconductor chip (S36). When there is no overflow, the sequence controller 18 executes the following S37 to S45.

The determination value as the index of the determination regarding whether the bad block formation is made is set (S37). Here, this determination value indicates the tolerance number of the local defective column for each block.

For example, when the area is composed of plural blocks, if the sum of the global defective columns and the local defective columns in the area is over the number of the redundancy columns, it is impossible to save the redundancy columns. Here, by taking the blocks containing the defective columns over the determination value as the defective blocks, the number of the defective columns in the area is decreased; as the sum of the number of the global defective columns and the number of the local defective columns is not over the number of the redundancy columns, it is possible to prevent a case in which all of the blocks in the area are defective blocks.

After the determination value is set, a certain area Ex among the areas E1 to Ep (S38) is selected, and the column substituting register is reset (S39).

For the selected area Ex, the local defective column test is carried out (S40).

(S41) The local isolation latch ISOLAT_L is set with respect to the columns containing the local defects.

In the following, the operation will be explained in detail.

After the node COM is charged for all of the column write detecting sections 31, and the sequence controller 16 sets the verify detection signal Det on the "H" level, the gates of the transistors TA1 to TA8 of the column write detecting sections receive the result of the local defect test of the corresponding column. That is, the results of the various local defect tests are input into all of the column write detecting sections 31. For example, when there is defect in the cells arranged in the area Ex of the bit line BL1, the "H" level is input to the transistor TA1 corresponding to the bit line BL1, and the "L" level is input to the gates of the other transistors TA2 to TA8.

As a result, if there is defective cell in at least one bit line of the column, the corresponding transistor TA is turned on, and the potential of the node COM is discharged.

When the node COM is discharged, the transistor TR1 is turned on, and the node NCOM is charged.

Here, the local isolation reset signal ISORSET_L is reset at the "H" level, and all of the local isolation latches ISOLAT_L are reset at the "L" level. Then, as the local isolation set signal ISOSET_L is set at the "H" level, the "H" level of the node NCOM of the column containing the local defect is transferred to the local isolation latch ISOLAT_L, and it is set there. That is, when there is an open defect of the memory hole in at least 1 bit line of the column, the local isolation latch ISOLAT_L is set at the "H" level. When there is no defect, the "L" level is kept as it is for the local isolation latch ISOLAT_L.

As the column write detecting sections 31 and the write detection control sections 32 carry out the same operation for each column, after S41, the result of the local defect test is registered in the local isolation latch ISOLAT_L of all of the columns.

Also, as the global isolation latch ISOLAT_G that is set with respect to the defective column in S32 is kept set as it is, for the column where the global isolation latch ISOLAT_G it set, the AND circuit AL2 outputs the "L" level, and the transistor TL3 is kept off as it is, so that the local isolation latch ISOLAT_L is not set.

(S42) The global defective column information of the column redundancy area RB is set in the column substituting register. The setting operation is carried out in the same way as in S33.

(S43) The local defective column information of the column redundancy area RB is set in the column substituting register. For the setting operation, instead of the control being set at the "H" level for the global isolation determination signal ISOCHK_G in S33, control is carried out so that the local isolation determination signal ISOCHK_L becomes the "H" level. The other features of the operation are the same as those in S33. As a result of S42 and S43, the flag Flag0 corresponding to the redundancy column, a defective column, is set at data "1" (see FIG. 16B, the case in which there is global defective column in the redundancy column CRD2 and there is local defective column in the redundancy column CRD3).

(S44) The global defective column information of the normal area RA is set in the column substituting register. The setting operation is carried out in the same way as in S34. As a result of S43, the redundancy column without the column defect substitutes the column of the normal area RA for the global defective column.

Figures 16D, 17:
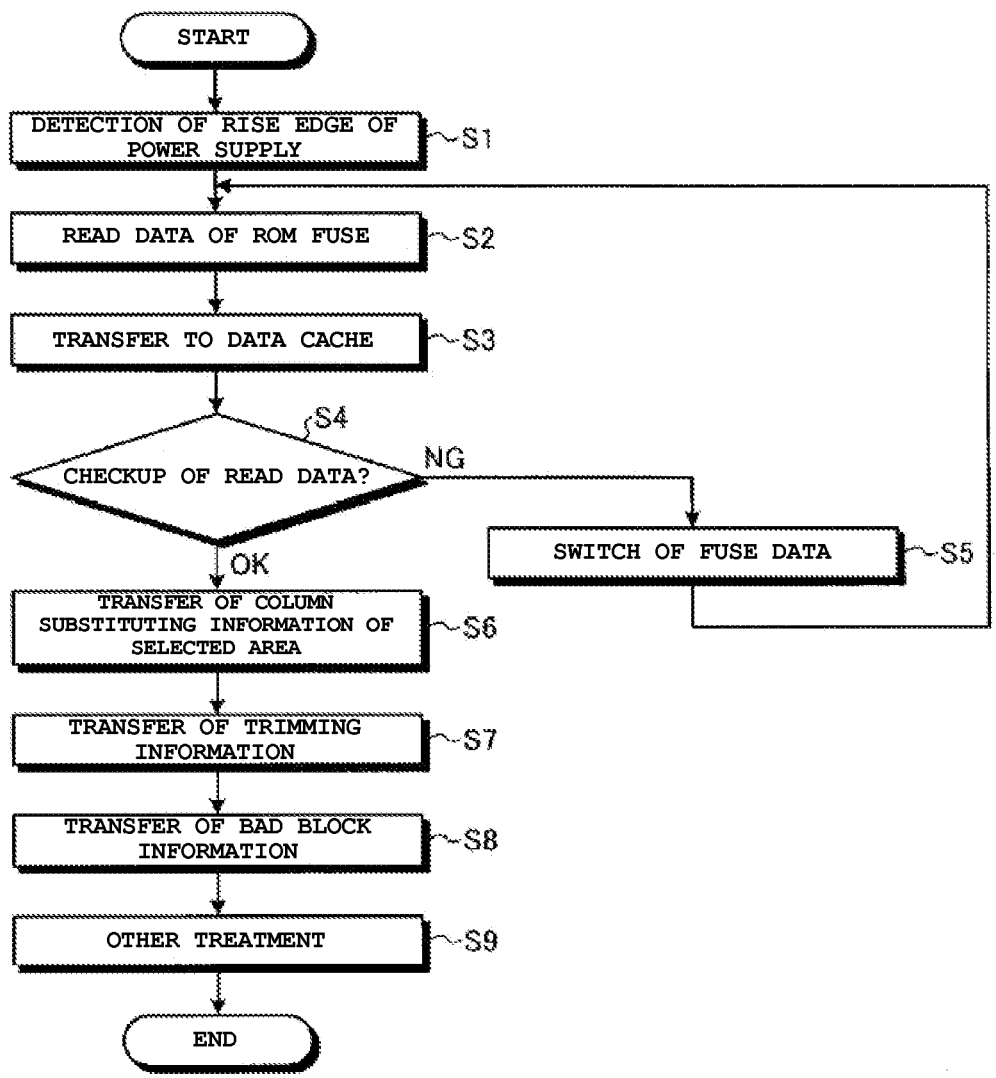

The flag Flag1 corresponding to the redundancy column adopted for substituting is set at data "1," and the column address of the substituting origin is registered (see FIG. 16C, the case wherein when there is the global defective column in the first column COL100 and the column 100 is substituted by the redundancy column CRD1). In FIGS. 16A to 16D, in order to facilitate an explanation of the illustration, the substituting origin address of "1FFF" is shown in the figure for the unused (both the Flag0 and Flag1 are 0) redundancy column and for the unusable redundancy column (Flag0 is "1"). For example, the reset value is kept as the substituting origin address.

(S45)

Then, the sequence controller 18 determines whether the number of the defective columns set in the column substituting register is over the number of the redundancy columns (S45). When overflow takes place with reference to the status register, the sequence controller 18 executes the following steps of operation S51 to S55. On the other hand, when there is no overflow, the sequence controller 18 executes the following step of operation S46.

In order to facilitate the explanation, in the following, the step of operation S46 will be explained.

The local defective column information of the normal area RA is set in the column substituting register (S46). In setting the operation, instead of the control adopted in S34 where the control is carried out to set the "H" level for the global isolation determination signal ISOCHK_G, in this case, control is carried out so that the local isolation determination signal ISOCHK_L becomes the "H" level. The other features of the operation are the same as those in S33. As a result of S46, the redundancy column without column defect, that is, the redundancy column without substituting in S44, substitutes the column of the normal area RA for the local defective column.

The flag Flag1 corresponding to the redundancy column adopted in substituting in S46 is set at data "1," and the column address of the substituting origin is registered (see FIG. 16D, the case in which there is local defective column in the column 200).

Then, determination is made on whether the number of the defective columns set in the column substituting register overflows the number of the redundancy columns (S47). Here, if no overflow takes place, the contents of the column substituting register (for the area Ex selected in S38, yes/no of column defect of the redundancy column CRD, yes/no of use by substituting, and the column address of the substituting origin when substitution is carried out) are written in the ROM fuse (S48).

Then, the local isolation reset signal ISORSET_L is set at the "H" level, and the local isolation latch ISOLAT_L is reset. Also, the determination value is reset at the initial value (S49).

Here, when the area other than the area Ex selected in S38 is not the final area (S50), it returns to S38 after assigning the next area Ex+1 (S56). This operation is carried out repeatedly until of the contents of the column substituting register for all of the areas E1 to Ep have been written in the ROM fuse.

On the other hand, when there is overflow in S45 or S47, the sequence controller 18 determines whether the area Ex selected in S38 is composed of 1 block (S51). If the selected area Ex is composed of 1 block, the block of the selected area Ex is converted to the bad block (S52).

On the other hand, when the selected area Ex is composed of plural blocks, among the blocks belonging to the selected area Ex, the block containing the column defect over the determination value is taken as the bad block, and the remaining blocks are used to reconstruct the area Ex. When all of the blocks are converted to the bad blocks, the bad conversion rate increase, the necessary surplus block number increases, the area becomes larger, and the chip costs increase.

That is, after resetting the local isolation latch ISOLAT_L (S53), the local defect test is carried out for each of the blocks that form the area Ex (S54). Then, the number of the columns where the local isolation latch ISOLAT_L is set (the number of the local defective columns) is counted, and the blocks containing defects over the determination value are converted to the bad blocks. For all of the blocks in the area Ex, the local defect test is carried out, and, after the determination value is decremented (S55), it returns to S39.

For example, suppose the area includes 4 blocks A to D. Also, suppose there exists no global column defect, the block A has local defective columns at the column addresses 1, 3 and 5, the block B has local defective columns in the column address 7, and the blocks C and D have no defective column.

In this case, in the step of operation S48, for this area, it is only possible to determine that there exist defects at the column addresses 1, 3, 5, and 7.

At this time, if there are only 3 voids in the redundancy column, it is impossible to save the 4 columns corresponding to the column addresses 1, 3, 5, and 7. Here, the local defect test is carried out for each block. Then, only the block A with the local defective column is converted to the bad block and taken out of the subjects of the local defect column test. Then, the local defective column test is carried out again in area units.

In this case, the defective columns in this area are only at the column address 7, and it is possible to save the defects by the column redundancy, so that the blocks B to D can be utilized. In this case, for example, when the determination value is set at 2, it is possible to convert the block A alone as the bad block. When the determination value is set at 2, as a result of re-execution of the local defect test in the area units, it is necessary to further decrease the determination value when another fail takes place.

For example, suppose the default determination value is 4, treatment for converting the bad blocks is not carried out blocks A, B, C, and D (S54). The determination value is decremented (S55). For example, the determination value is decreased by 1, and the determination value becomes 3. Then, it returns to S39, and the test is carried out again. In this case, because the blocks A, B, C, and D are converted as the bad blocks, overflow takes place just as mentioned previously. However, in S54, the determination value becomes 3, so that the block A is subject to treatment to convert it to the bad block. When decrement treatment is carried out in S55 again, the determination value becomes 2. Then, once again, it goes to S39 to carry out the test, and, in this case, overflow does not take place.

In addition, when the overflow treatment is carried out for a few rounds, it becomes difficult to estimate the time for die sort. Consequently, if the determination value is preset at "1" (conversion is made to the bad block even when there is one local defect column), transition to S51 is carried out up to one round for each area. That is, when the determination value is increased and the transition is made to S51 in some rounds, it is possible to minimize the blocks converted to the bad blocks, while it is difficult to estimate the die sort time. On the other hand, if the determination value is 1, in the example, the blocks A and B are converted to the bad blocks, and overkill takes place for the blocks that are health at a certain degree. However, it is possible to estimate the maximum time for die sort in up to 1 round of S51 for each area.

In addition, as shown in FIGS. 16A to 16D, in each redundancy column, the flags Flag0 and Flag1 and the substituting origin address are held. However, the present invention is not limited to this scheme. For example, one may also adopt a scheme in which, for each redundancy column, both the table listing the flag Flag0 and flag Flag1, the substituting origin addresses corresponding to each other, and the table that registers the desired column addresses as the column defects without setting the substituting destination may be adopted. In the table where the desired addresses are registered as the column defects without setting the substituting destination, the flag Flag0 and flag Flag1 are set corresponding to the substituting origin address, and they are not set corresponding to the address of the substituting destination. The FF data are held in the desired columns, and the desired columns are taken out of the detection subjects of verify for the nonvolatile semiconductor memory device.

FIG. 17 is a flow chart illustrating the boot treatment of the nonvolatile semiconductor memory device shown in FIG. 7.

As shown in FIG. 17, the power supply detector 20 shown in FIG. 7 detects the rise edge of the power supply (S1), that is, the power supply detector 20 detects power-on.

The sequence controller 18 reads the fuse data from the ROM fuse 30 (S2). Then, the read fuse data are sent to the data cache 14 (S3). The transferred fuse data are held in the data cache 14.

Then, the read fuse data are checked (S4). For example, checkup of the fuse data is carried out on the basis of the pattern of the determination data in the fuse data. This pattern of the determination data is read, and the sequence controller 18 determines whether the read pattern of the determination data is the desired pattern.

Here, when the pattern of the determination data is not the desired pattern, it is switched to another fuse data (S5), and it returns to step S2. In other word, when the pattern of the determination data is not the desired pattern, the sequence controller 18 reads another fuse data from the ROM fuse 30 (for example, the determination data of another control information).

On the other hand, when the pattern of the determination data is the desired pattern, the column substituting information Dx of the selected area Ex among the fuse data held in the data cache 14 is transferred to the column substituting register 28 (S6).

Then, among the fuse data held in the data cache 14, the trimming information is transferred to the trimming register 29 (S7).

Next, among the fuse data held in the data cache 14, the bad block information is transferred to the sequence controller 18 (S8). Then, on the basis of the bad block information, the sequence controller 18 has the bad block flag set in the bad block flag register 12a, so that use of the block specified by the bad block information is prohibited.

Then, if there is other treatment, by carrying out the other treatment (S9), the boot sequence comes to an end.

(Third Embodiment)

FIG. 18 is a diagram illustrating an example of the column constitution of the nonvolatile semiconductor memory device shown in FIG. 7. Here, FIG. 18 shows an example in which the page size (the number of the bytes of the normal area that can be accessed by the user for each page) is 2K bytes, and the redundancy column for substituting the defective columns of the user access area has, e.g., 16 bytes. Also, when there is a storage capacity of 2 bits/cell, 3 data latches DL0[8:1], DL1[8:1], and DL2[8:1] are arranged with respect to the various columns, respectively.

As shown in FIG. 18, in the nonvolatile semiconductor memory device, 8 bit lines BL[8:1] are arranged for each column, and 8 sense amplifiers SA[8:1] are arranged corresponding to the various bit lines BL[8:1]. In the normal area RA shown in FIG. 2, the columns Col1 to Col2048 are arranged, and, in the column redundancy area RB, the redundancy columns CRD1 to CRD16 are arranged. Also, for each column, the local isolation latch ISOLAT_L that takes the local defective column as other than the detection subject in the write verify and global isolation latch ISOLAT_G that takes the global defective column as other than the detection subject in the write verify are arranged. In addition, in the column constitution, the write column detector 15 can be arranged in each of the columns Col1 to Col2048 and the redundancy columns CRD1 to CRD16.

FIG. 19A is a diagram illustrating an example of the column substituting information in the selected area according to the third embodiment. FIG. 19B is a diagram illustrating an example of substituting of the redundancy column when the redundancy column is defective. In third embodiment, instead of 2 flags, that is, flags Flag1 and Flag0 shown in FIG. 15, 4 flags, that is, flag Flag3 to flag Flag0, indicating the state of the redundancy columns CRD1 to CRD16 are arranged as an example.

As shown in FIG. 19A, as the column substituting information D1 to Dp shown in FIG. 5, 4 flags, that is, flag Flag3 to flag Flag0, indicating the state of the redundancy columns CRD1 to CRD16 are arranged. Also, the flag register F0 and F1 can be adopted for setting the local column substituting information. The flag registers F2 and F3 can be adopted in setting the global column substituting information. Also, the substituting origin column address (Col 100, Col 200, Col 300, Col 400, Col 500, Col 600, Col 700, Col 800, Col 900, Col 1000, Col 1100, or Col 1200) is registered in each of the redundancy columns CRD1 to CRD12. In addition, the substituting origin column should have 12 bits for the substituting origin column address when the normal area RA has 2K bytes and when the column redundancy area RB has 16 bytes.

When the redundancy columns CRD1 to CRD16 themselves are global defective columns, the flag Flag3 is set at "1." When substituting is carried out for the global defective column for by the redundancy columns CRD1 to CRD16, the flag Flag2 is set at "1." When the redundancy columns CRD1 to CRD16 themselves are the local defective columns, the flag Flag1 is set at "1." When the redundancy columns CRD1 to CRD16 carry out substituting for the local defective column, the flag Flag0 is set at "1." In addition, the priority for the explanation is in the order of flags Flag3, 2, 1, and 0. For example, when the flag Flag3 is "1," the redundancy column itself is the global defective column independent of the state of the other flags Flag2 to Flag0.

In addition, in the flag registers F3 to F0, the 4 flags Flag3 to Flag0 of the selected area Ei can be held for the redundancy columns CRD1 to CRD16. In the address register AD, it is possible to hold the substituting origin column address of the selected area Ei for the redundancy columns CRD1 to CRD16.

In the following in the die sort process before shipment, the explanation will focus on an example of the column constitution shown in FIG. 18 for the registering method of the column substituting information pieces D1 to Dp with respect to the ROM fuse 30 shown in FIG. 5.

When any defects of the bit lines BL1 to BLm, such as open/short defects, as well as defects in the sense amplifier 13 or data cache 14, are detected, the detection test is carried out for the global defective column as the byte unit containing the defective bits. Here, for the global defective column, the global isolation latch ISOLAT_G is set at the "H" level. As the global isolation latch ISOLAT_G is set at the "H" level, in the later verify operation, the verify pass is detected, and it is handled as other than the detection subjects.

As the method for setting the global isolation latch ISOLAT_G, for example, if the bit line open test is carried out, the operation is carried out so that the data latch DL2[8:1] of the column that is open becomes "L". Then, after the node COM is precharged via the transistor TR2, the verify detection signal Det is set at the "H" level. In this case, in the global defective column, the node NCOM is charged to the "H" level. In this state, as the global isolation set signal ISOSET_G is set at the "H" level, the global isolation latch ISOLAT_G is set.

Upon the end of the detection test of the global defective column, the detection test of the local defective column is carried out. In the following, the explanation will focus on the redundancy substituting method with the open defect (string open) of the memory hole as the local defective column as an example.

In the memory hole open defect test, erase is carried out for all of the blocks of the area Ex (x is an integer of 2 to p).

Then, the read operation is carried out for all of the strings of the area Ex. For example, upon confirmation that the threshold becomes 0 V or lower for all of the memory cells, 0 V is applied to all of the word lines of the selected string, and the read operation is carried out. When the selected string is not defective, the read data become "1."

Here, the probability of the string open defect is high for the column with the read data of "0". For such a local defective column, each time it is detected, the local isolation latch ISOLAT_L is set at the "H" level. When the local isolation latch ISOLAT_L is set at the "H" level, it is detected as the verify pass and excluded from the detection subjects in the later verify operation.

The method for setting the local isolation latch ISOLAT_L is as follows. Among the data latches DL2 [8:1] of the local defective column, operation is carried out to set the data latch DL2 corresponding to the defective bit at the "L" level. In the case of the open defect test of the memory hole, the read result may be transferred to the data latch DL2. Then, after the node COM is precharged via the transistor TR2, the verify detect signal Det is set at the "H" level. At this time, in the local defective column, the node NCOM is charged to the "H" level. In this state, by setting the local isolation latch signal ISOSET_L at the "H" level, the local isolation latch ISOLAT_L is set.

In addition, by carrying out the write test for all of the pages of the selected area Ex, it is possible to detect even more local defective columns.

Upon the end of the test of the local defective column for the area Ex, the collection treatment is carried out for the defective column information for registering the column substituting information pieces D1 to Dp shown in FIG. 5 in the ROM fuse 30. In this treatment, checkup is carried out for the redundancy columns CRD1 to CRD16 that have the global isolation latch ISOLAT_G become the "H" level. According to the method of this checkup operation, for all of the columns, the data latch DL2 [8:1] is set at "00," and, at the same time, the global isolation determination signal ISOCHK_G is set at the "H" level. Then, the verify determination signals CHK[CRD1] to CHK[CRD16] are sequentially set at the "H" level while incrementing from CRD1 to CRD16.

At this time, as the global isolation latch ISOLAT_G is set at the "H" level, the node LSEN is not discharged, so that the determination result RST becomes the "H" level. That is, when the verify determination signals CHK[CRD1] to CHK[CRD16] are sequentially set at the "H" level while incrementing from CRD1 to CRD16, the redundancy columns CRD1 to CRD16 with the determination result RST is on the "H" level become the global defective column. That is, when the global isolation latch ISOLAT_G becomes the "H" level, it indicates that the redundancy columns CRD1 to CRD16 are the global defective column. In such case, in the corresponding redundancy columns CRD1 to CRD16, "1" is set in the flag register F3 shown in FIG. 19A. This checkup is carried out for all of the redundancy columns CRD1 to CRD16 of the redundancy area RB.

Then, checkup is carried out for the columns Col1 to Col2048 of the normal area RA where the global isolation latch ISOLAT_G becomes the "H" level. When the columns Col1 to Col2048 where the global isolation latch ISOLAT_G is on the "H" level are detected, the information for substituting the columns Col1 to Col2048 by the normal unused redundancy columns CRD1 to CRD16 is registered. That is, for the redundancy columns CRD1 to CRD16 with the flag register F3 of "0" and with the flag register F2 of "0", the address of the columns Col1 to Col2048 where the global isolation latch ISOLAT_G becomes the "H" level is registered in the address register AD. Also, "1" is set at the flag register F2. This checkup is carried out for all of the columns col1 to col2048 of the normal area RA.

Then, for the redundancy columns CRD1 to CRD16 where the local isolation latch ISOLAT_L becomes the "H" level, checkup is carried out for each of areas E1 to Ep. Here, when the local isolation latch ISOLAT_L becomes the "H" level, it indicates that, in the selected area Ex, the corresponding redundancy columns CRD1 to CRD16 themselves are the local defective column. In this case, in the corresponding redundancy columns CRD1 to CRD16, the flag register F1 is set at "1," and this checkup is carried out for all of the redundancy columns CRD1 to CRD16 of the column redundancy area RB.

Then, checkup is carried out for the columns Col1 to Col2048 of the normal area RA where the local isolation latch ISOLAT_L becomes the "H" level. When the columns Col1 to Col2048 where the local isolation latch ISOLAT_L becomes the "H" level are detected, the information indicating that the columns Col1 to Col2048 are substituted by the normal and unused redundancy columns CRD1 to CRD16 is registered. That is, with respect to the redundancy columns CRD1 to CRD16 with the flag registers F0 to F3 of "0", the address of the columns Col1 to Col2048 with the local isolation latch ISOLAT_L is on the "H" level is set in the address register AD. Also, "1" is set in the flag register F0. This checkup is carried out for all of the columns Col1 to Col2048 of the normal area RA in the selected area Ex.

Here, for the redundancy columns CRD1 to CRD16 having flag register F3 of "0" and having flag register F2 of "1" and flag register F1 of "1", it indicates that the redundancy columns CRD1 to CRD16 that have substituted the global defective columns are local defective columns. For the redundancy columns CRD1 to CRD16 having flag register F3 of "1" and flag register F2 also of "1," it indicates that the redundancy columns CRD1 to CRD16 that have substituted the global defective columns are global defective columns.

For example, for the selected area Ex, when checkup has ended, the column substituting information Dx shown in FIG. 19A is set in the flag registers F3 to F0 and the address register AD.

For the redundancy column CRD4, it is supposed that the flag register F3 is "0," the flag register F2 is "1," the flag register F1 is "1," and the address of the Col400 is registered in the address register. That is, for the redundancy column CRD4, because it is not a global defective column, after the column Col400, a global defective column, is substituted, it is determined to be a local defective column. In this case, the data of the column Col400 is not correctly substituted.

When such a case takes place, it is necessary to have the procedure to change the substitution destination of the global defective column. More specifically, as shown in FIG. 19B, when there exists the redundancy column CRD4 having flag register F3 of "0" and flag registers F2 and F1 of "1," the substituting destination is changed to the unused redundancy column CRD12, which is neither global defective column nor local defective column. In this case, as shown in FIG. 19A, flag registers F0 to F3 are set at "0" in the redundancy column CRD12. Then, while the flag register F0 is set at "1" for the redundancy column CRD12, the address of the column Col400 is registered in the address register AD.

This operation is carried out on the redundancy column having flag register F3 of "0" and flag registers F2 and F1 of "1."

Also, the redundancy columns CRD1 and CRD3 have the flag register F3 and F2 of "1," and the addresses of the columns Col100 and Col300 as the substituting origin column address are registered. That is, although the redundancy columns CRD1 and CRD3 are global defective columns, the columns Col100 and Col300, global defective columns, are substituted. In this case, the data of the columns Col100, Col300 are not correctly substituted.

Consequently, as shown in FIG. 19B, when there exists redundancy columns CRD1 and CRD3 having flag registers F3 and F2 of "1," the substituting destination is changed to the unused redundancy columns CRD14 and CRD15 that are neither global defective columns nor local defective columns. In this case, as shown in FIG. 19A, for the redundancy columns CRD14 and CRD15, the flag registers F3 to F0 are set at "0." Then, for the redundancy columns CRD14 and CRD15, while the flag register F2 is set at "1," the addresses of the Col300 and Col100 are registered in the address register AD.

Then, for all of the redundancy columns CRD1 to CRD16, when the flag registers F0 to F3 and the substituting origin column address are set in the flag Flag0 to Flag3 of the area Ex and the address register AD, the write data are transferred via the sequence controller 18 to the sense amplifier 13, and the column substituting information Dx is registered in the ROM fuse 30.

Then, the treatments are sequentially carried out for all of the areas E1 to Ep, and the column substituting information pieces D1 to Dp are registered in the ROM fuse 30. Here, the global defective column is common for all of the areas E1 to Ep. Consequently, all of the register information of the redundancy columns CRD1 to CRD16 and the local isolation latch ISOLAT_L alone are reset, and the global isolation latch ISOLAT_G is not reset.

In the following, the operation of the portion related to the column redundancy after shipment of the product will be explained with reference to the column constitution shown in FIG. 18.

When power is turned on (when power-on), the fuse data are read. In this case, when the column substituting information has the constitution shown in FIG. 5, by taking the column substituting information Dx of the area Ex as reference, for the redundancy columns CRD1 to CRD16 of the selected area Ex, the flag information and the address information are set in the column substituting register 28. Also, depending on the user, after reading power-on, the area initially accessed may be determined, so that it is preferred that the area initially set by the user be taken as selectable.

Then, as the flag information and address information are set in the column substituting register 28 for the redundancy columns CRD1 to CRD16, on the basis of this flag information and the address information, the local isolation latch ISOLAT_L and the global isolation latch ISOLAT_G are set.

What have the global isolation latch ISOLAT_G set there are the redundancy columns CRD1 to CRD16 having the flag register F3 of "1," and the columns Col1 to Col2048 assigned by the address set in the address register AD of the redundancy columns CRD1 to CRD16 where the flag register F2 becomes "1."

What have the local isolation latch ISOLAT_L set there are the redundancy columns CRD1 to CRD16 having the flag register F1 of "1," and the columns Col1 to Col2048 set by the address register AD of the redundancy columns CRD1 to CRD16 where the flag register F0 is "1."

The column ColN assigned by the column address N is a global defective column, and the global isolation latch ISOLAT_G is set in this column ColN. In this case, for example, the data latch DL2 [8:1] of all of the columns Col1 to Col2048 are preset at the "H" level, and the verify determination signal CHK [N] of the corresponding column ColN is set at the "H" level. In this state, the verify detection signal Det is set at the "H" level, the node COM of the column address N is discharged to the "L" level. The transistor TR1 is turned on, and the node NCOM is charged. After the global isolation latch ISOLAT_G is reset at the "L" level, the global isolation set signal ISOSET_G is set at the "H" level, and the data are transferred to the global isolation latch ISOLAT_G. After that, in the verify operation, the column ColN always returns to the pass determination.

When the local isolation latch ISOLAT_L is set, instead of the global isolation set signal ISOSET_G, the local isolation set signal ISOSET_L is set at the "H" level. In this way, on the basis of the flag information set in the column substituting register 28, the global isolation latch ISOLAT_G or the local isolation latch ISOLAT_L can be set at the "L" level.

During the power-on read, the flag information and the address information of the selected area Ex are set in the column substituting register 28; even when the global isolation latch ISOLAT_G and the local isolation latch ISOLAT_L are set on the basis of this flag information and address information, once the selected area Ex is replaced by the selected area Ex+1, the flag information and the address information of the selected area Ex+1 are set in the column substituting register 28. On the basis of this flag information and address information, the global isolation latch ISOLAT_G and the local isolation latch ISOLAT_L are set.

That is, when the area switching takes place, for the redundancy columns CRD1 to CRD16 having the flag register F1 or the flag register F0 of "1", the local defective column information is set, so that it is reset. Reset is carried out in the same way for the local isolation latch ISOLAT_L, too. For resetting of the local isolation latch ISOLAT_L, the local isolation reset signal ISORSET_L may be set at the "H" level.

Upon end of the reset of the local defective column information before switching the area, the flag information and the address information of the newly selected area Ex+1 are set in the column substituting register 28. In order to obtain the flag information and the address information of the selected area Ex+1, the column substituting information Dx+1 is read from the ROM fuse 30.

Here, for the redundancy columns CRD1 to CRD16 where the flag register F3 is set at "1," the flag registers F3 to F0 and the address register AD are not refreshed. For the redundancy columns CRD1 to CRD16 where the flag register F2 is set at "1," only the flag register F1 is refreshed by area switching, while the others are not refreshed. Even when the column is not the global defective column, it may still be a local defective column. Upon the end of update of the column substituting register 28, the local isolation latch ISOLAT_L is set.

(Fourth Embodiment)

Figure 20:
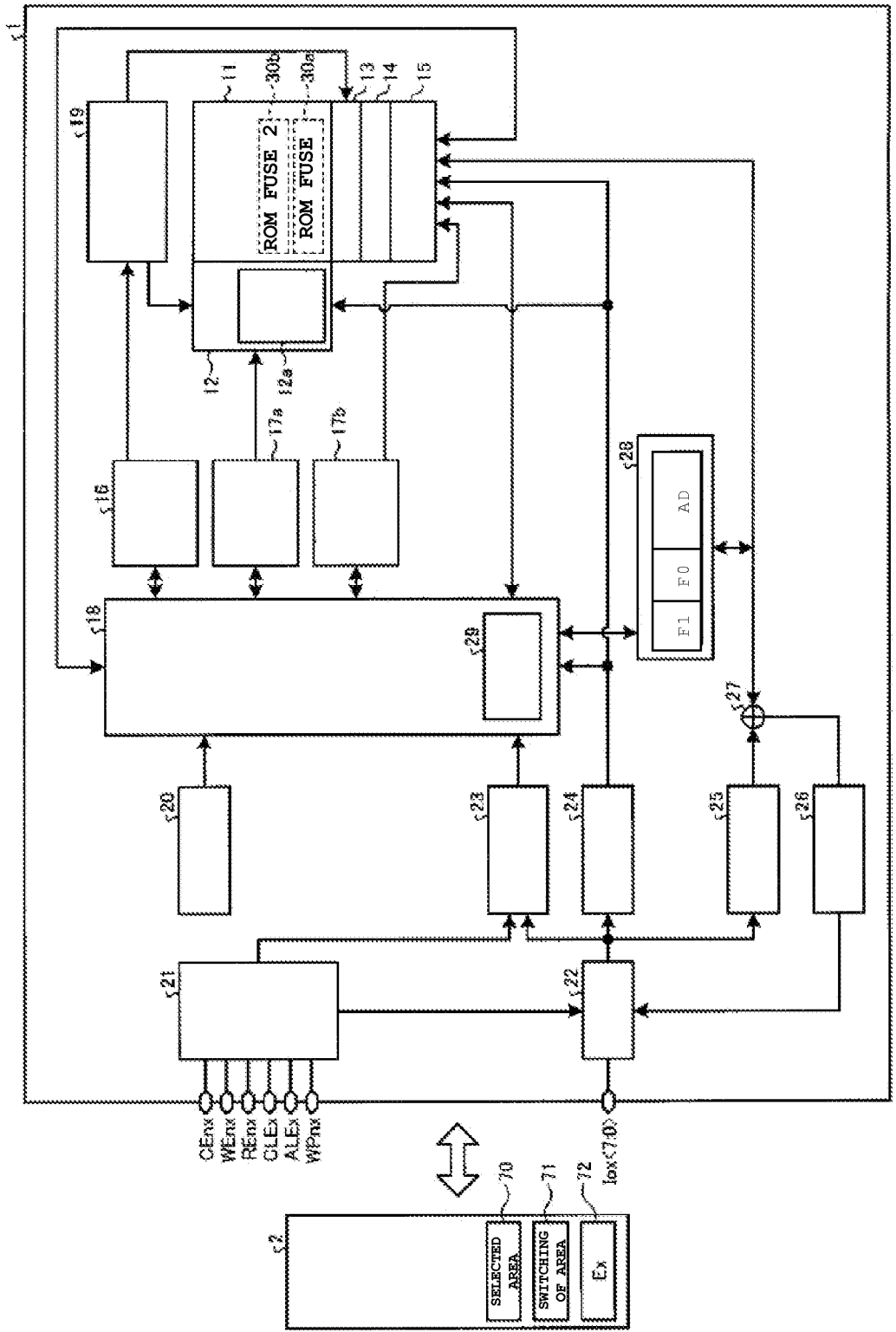
FIG. 20 is a schematic block diagram illustrating the nonvolatile semiconductor memory device according to a fourth embodiment.

FIG. 20 is a block diagram illustrating schematically the nonvolatile semiconductor memory device 1 and the controller 2 according to the fourth embodiment. Here, the nonvolatile semiconductor memory device may be the so-called planar NAND flash memory or the three-dimensional NAND flash memory.

The nonvolatile semiconductor memory device 1 according to the present embodiment differs from the nonvolatile semiconductor memory device in the second embodiment (FIG. 7) in the memory cell array 11, the sequence controller 18, and the controller 2. The remaining features are the same as mentioned previously, and they will not be explained in detail again.

The memory cell array 11 has not only the ROM fuse (first ROM fuse) 30a, but it also has the ROM fuse (second ROM fuse) 30b.

The nonvolatile semiconductor memory device of the present embodiment does not have the selected area determination section 18a and the area switching instruction section 19b in the sequence controller 18 of the second embodiment, yet it has a trimming register 29.

The controller 2 in the present embodiment has a selected area determination section 70, an area switching instruction section 71, and a selected area register 72. The selected area determination section 70 can determine which selected area of the memory cell array 11 is accessed on the basis of the address input from the outer side. The area switching instruction section 71 controls the nonvolatile semiconductor memory device 1 so that, when the area is switched on the basis of the selected area determination section 70, the nonvolatile semiconductor memory device executes the ROM read operation. The selected area register 72 holds the information of the area Ex corresponding to the column substituting information Dx held in the column substituting register 28.

Figure 21:
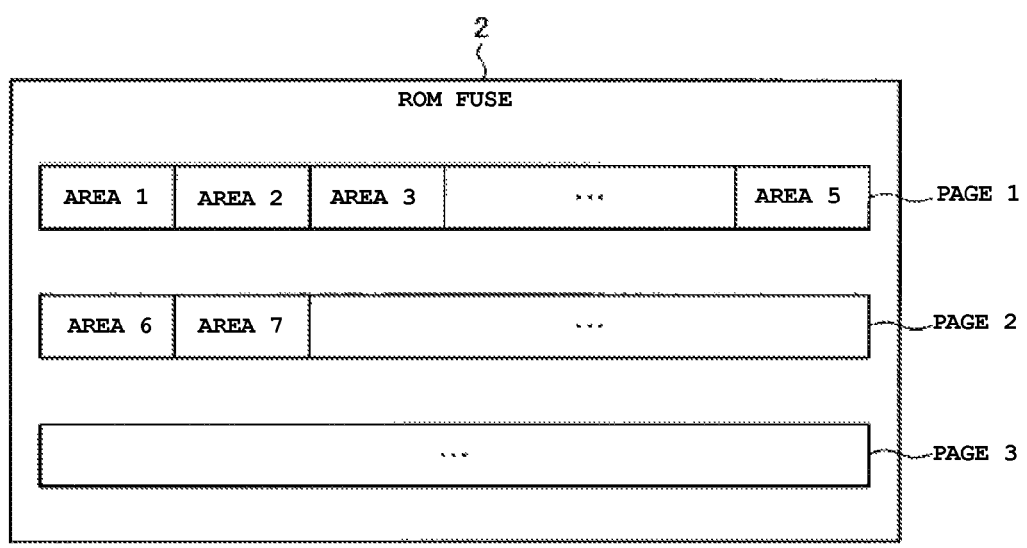
FIG. 21 is a block diagram illustrating an example of the constitution of the second ROM fuse shown in FIG. 20.

The second ROM fuse 30b holds the column substituting information pieces D1 to Dp of each area. As shown in FIG. 21, for example, the second ROM fuse 30b has plural pages (in FIG. 21, page 1, page 2, page 3). For example, the data are held in ascending/descending order of the area numbers, the column substituting information pieces D1 to D5 of the area 1 to area 5 are held on the page 1, and the column substituting information pieces D6 and D7 of the area 6 and the area 7 are held on page 2. Also, the first ROM fuse 30a has the trimming information and bad block information of the voltage values registered in addition to, e.g., the column substituting information.

In the following, the operation of the nonvolatile semiconductor memory device of the present embodiment in the power-on state will be explained.

When the nonvolatile semiconductor memory device 1 detects power-on, the sequence controller 18 accesses the first ROM fuse 30a; the trimming information is transferred to the trimming register 29; the bad block information is transferred to the bad block flag register 12a; and, e.g., the column substituting information D1 of area 1 is transferred to the column substituting register 28. The trimming register 29 holds the trimming information, the bad block flag register 12a holds the bad block information, and the column substituting register 28 holds the column substituting information D1. Here, the area 1 is an area containing the management block (block holding the acquired bad block information) and the second ROM fuse 30b.

In addition, the data indicating the area E1 corresponding to the column substituting information D1 held in the column substituting register 28 are transferred from the nonvolatile semiconductor memory device 1 to the controller 2. The selected area register 72 of the controller 2 holds the data indicating the selected area E1.

Figure 22:
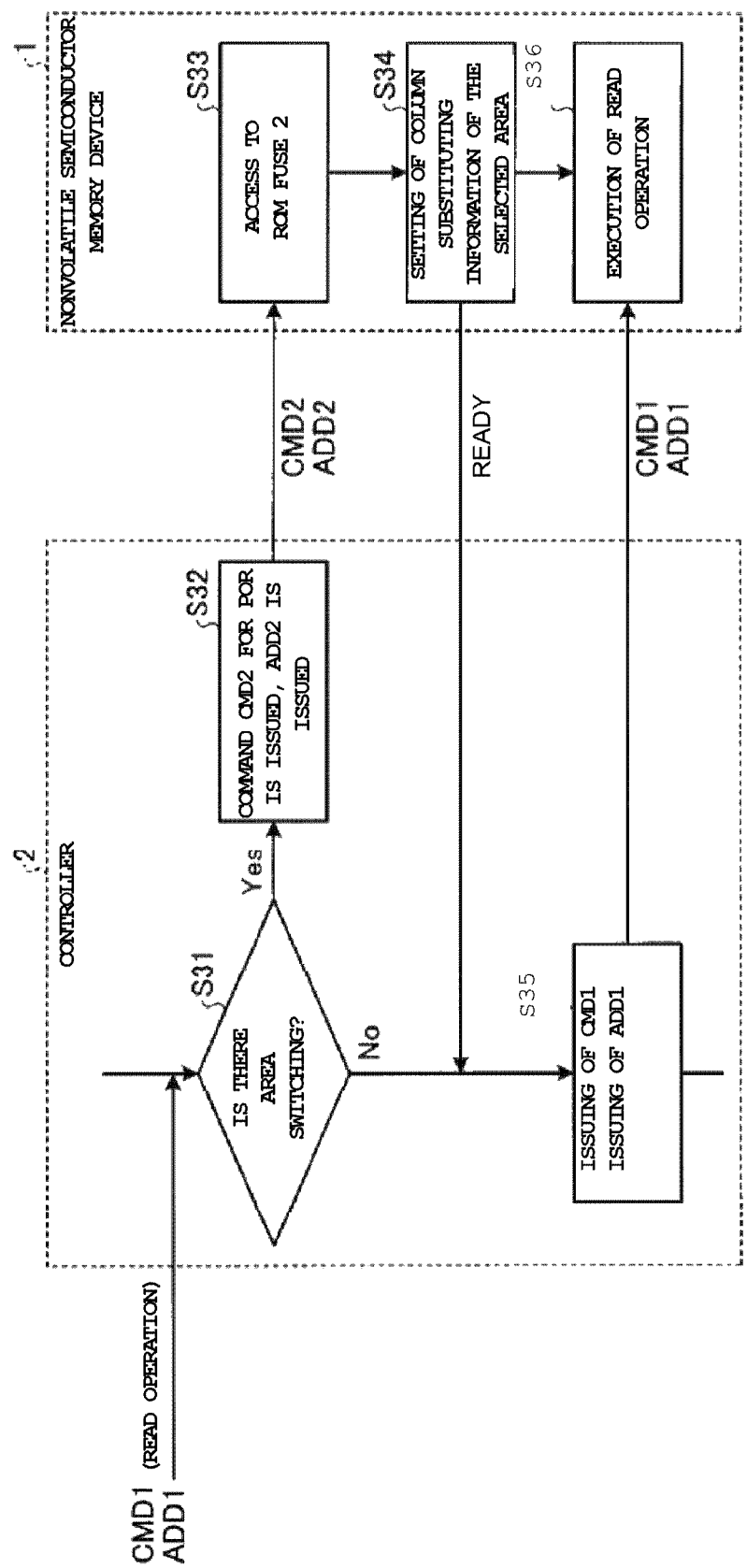
FIG. 22 is a flow chart illustrating the read operation of the nonvolatile semiconductor memory device shown in FIG. 20.

In the following, the read operation of the nonvolatile semiconductor memory device will be explained with reference to the flow chart shown in FIG. 22.

As the controller 2 receives the read command CMD1 and the address ADD1 from the external host equipment, and the selected area determination section 70 of the controller 2 computes the area Ei corresponding to the address ADD1. The selected area determination section 70 determines whether the computed area Ei is the area Ej (j=1 in the initial state) held in the selected area register 72 (S31).

The area Ei is different from the area Ej, and, when the selected area determination section 70 determines there is area switching (Y in S31), the area switching instruction section 71 issues the read command CMD2 for power-on read (POR) of the column substituting information Di of the second ROM fuse and the address ADD2i that assigns the position where the column substituting information Di is held among the second ROM fuse (corresponding to the area Ei) to the nonvolatile semiconductor memory device 1 (S32).

When the nonvolatile semiconductor memory device 1 receives the command CMD2 and address ADD2, the sequence controller 18 accesses the column substituting information Di among the second ROM fuse (S33). The sequence controller 18 resets the column substituting information Dj held in the column substituting register 28 and then sets the column substituting information Di in the column substituting register 28 (S34).

When the column substituting information is set in the column substituting register 28, the nonvolatile semiconductor memory device 1 outputs a ready information to the controller 2. On the basis of the ready information, the controller 2 issues the read command CMD1 and the address ADD1 to the nonvolatile semiconductor memory device 1 (S35).

On the basis of the column substituting information Di, the nonvolatile semiconductor memory device 1 reads the data of the desired page among the area Ei (S36).

As previously explained, the present embodiment can provide a nonvolatile semiconductor memory device that can increase the saving efficiency with respect to the defects.

(Fifth Embodiment)

Figure 23:
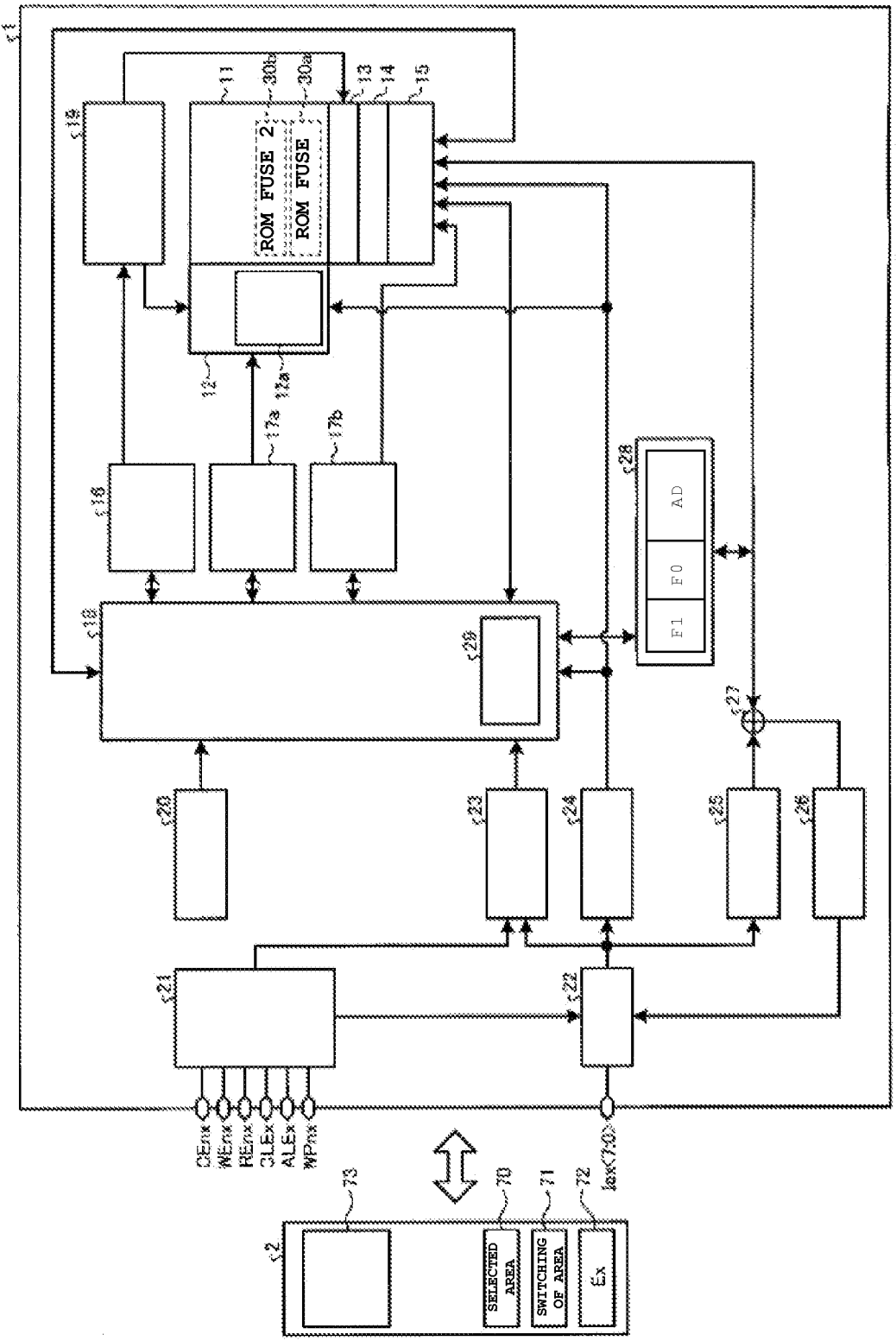
FIG. 23 is a schematic block diagram illustrating the constitution of the nonvolatile semiconductor memory device according to a fifth embodiment.

In the following, the nonvolatile semiconductor memory device 1 and the controller 2 according to the fifth embodiment will be explained with reference to the block diagram in FIG. 23.

The constitution of the nonvolatile semiconductor memory device of the present embodiment is the same as that of the fourth embodiment, and it will not be explained in detail again. As shown in FIG. 23, the controller 2 in the present embodiment has a constitution wherein the cache 73 is added to the controller 2 in the fourth embodiment.

In the following, the sequence of the nonvolatile semiconductor memory device 1 and the controller 2 in the present embodiment will be explained with reference to the flow charts shown in FIGS. 24 and 25.

First, the operation of the nonvolatile semiconductor memory device in the present embodiment in the power-on state will be explained with reference to FIG. 24.

Figure 24:
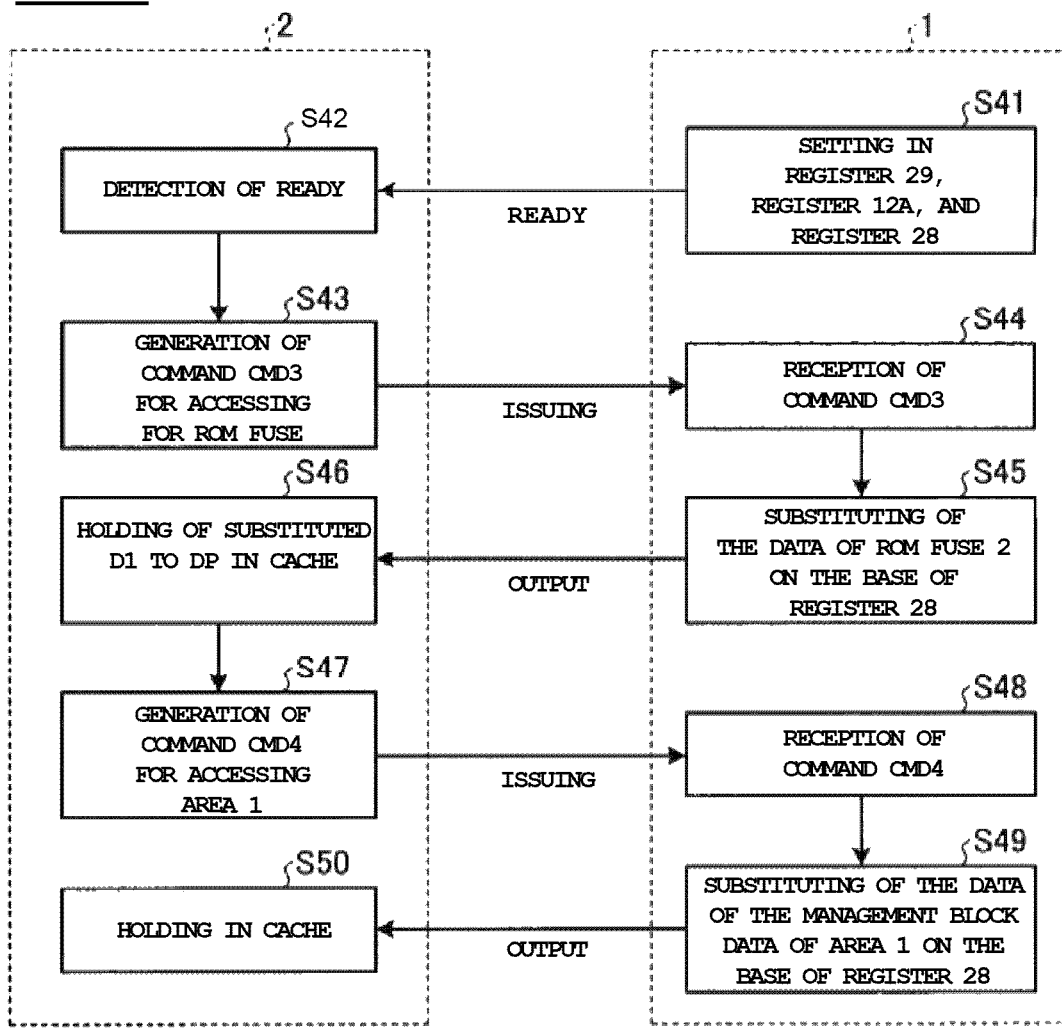
FIG. 24 is a flowchart illustrating the operation after power-on of the nonvolatile semiconductor memory device shown in FIG. 23.

As shown in FIG. 24, when the nonvolatile semiconductor memory device 1 detects the power-on state, the sequence controller 18 accesses the first ROM fuse 30a, sends the trimming information to the trimming register 29, sends the bad block information to the bad block flag register 12a, and sends the column substituting information D1 to the column substituting register 28. The trimming register 29 sets the trimming information, the bad block flag register 12a sets the bad block information, and the column substituting register 28 sets the column substituting information D1 (S41). Here, the area 1 is an area containing the management block (a block holding the acquired bad block information) and the second ROM fuse 30b.

Also, the data indicating the area E1 corresponding to the column substituting information D1 held in the column substituting register 28 are transferred from the nonvolatile semiconductor memory device 1 to the controller 2 (S41). The selected area register 72 of the controller 2 holds the data that indicate the selected area E1.

After the end of the set operation of S41, the nonvolatile semiconductor memory device 1 outputs the ready information to the controller 2.

Then, on the basis of the ready information (S42), the controller 2 generates the command CMD 3 (S43). This command CMD 3 is a command that controls the nonvolatile semiconductor memory device 1 so that column substituting information pieces D1 to Dp of all of the areas held by the nonvolatile semiconductor memory device 1 in the second ROM fuse 30b are output to the controller 2.

On the basis of the command CMD 3 (S44), the nonvolatile semiconductor memory device 1 outputs the column substituting information pieces D1 to Dp of all of the areas held in the second ROM fuse 30b to the controller 2 (S45). When there is the global defective column or local defective column in the area E1 containing the second ROM fuse 30b, the sequence controller 18 substitutes it on the basis of the data of the column substituting register D1 and outputs the column substituting information pieces D1 to Dp to the controller 2 (S45).

The controller 2 holds the substituted column substituting information pieces D1 to Dp in the cache 73 (S46).

The controller 2 generates the command CMD4 (S47). This command CMD4 is a command that controls the nonvolatile semiconductor memory device 1 so that the data of the management block of the area 1 (the delayed bad block information) are output to the controller 2.

On the basis of the command CMD4 (S48), the nonvolatile semiconductor memory device 1 outputs the data of the management block (the delayed bad block information) to the controller 2 (S49). Just as in S45, when there is the global defective column or the local defective column in the area E1 containing the second ROM fuse 30b, the sequence controller 18 substitutes it on the basis of the data of the column substituting register D1 and outputs the data of the management block (the delayed bad block information) to the controller 2 (S49).

The controller 2 holds the data of the substituted management block in the cache 73 (S50).

In the following, the read operation of the nonvolatile semiconductor memory device will be explained with reference to FIG. 25.

Figure 25:
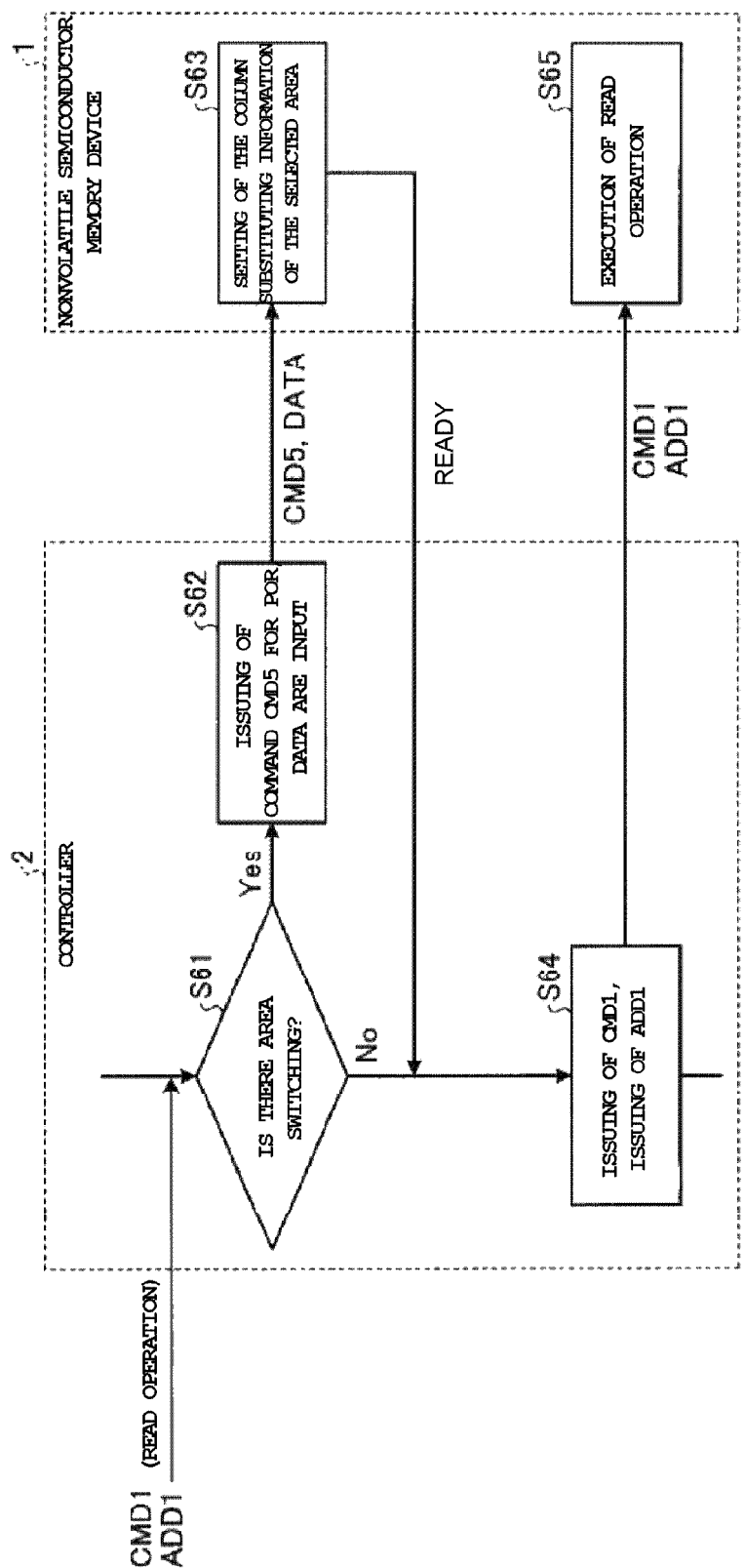
FIG. 25 is a flow chart illustrating the read operation of the nonvolatile semiconductor memory device shown in FIG. 23.

As shown in FIG. 25, as the controller 2 receives from the external host equipment the read out command CMD1 and the address ADD1, the selected area determination section 70 of the controller 2 computes the area Ei corresponding to the address ADD1. The selected area determination section 70 determines whether the computed area Ei is the area Ej (j=1 in the initial state) held in the selected area register 72 (S61).

The area Ei is different from the area Ej, and when the selected area determination section 70 determines that there is area switching (Y in S61), the area switching instruction section 71 outputs to the nonvolatile semiconductor memory device 1 the command CMD5 for power-on read (POR) and the data of the area substituting information Dj to set the area substituting information Dj held in the cache 73 in the column substituting register 28 (S62).

When the nonvolatile semiconductor memory device 1 receives the command CMD5 and the data, the sequence controller 18 resets the column substituting information Dj held in the column substituting register 28 and then sets the column substituting information Di in the column substituting register 28 (S63).

When the column substituting information is set in the column substituting register 28, the nonvolatile semiconductor memory device 1 outputs the ready information to the controller 2. On the basis of this ready information, the controller 2 issues the read command CMD1 and the address ADD1 to the nonvolatile semiconductor memory device 1 (S64).

On the basis of the column substituting information Di, the nonvolatile semiconductor memory device 1 reads the data of the desired page among the area Ei.

As previously explained, the present embodiment can provide a nonvolatile semiconductor memory device that can increase the saving efficiency for the defects.

According to the present embodiment, the data of the first ROM fuse 30a (e.g., the data of area 1) are set in the trimming register 29, the bad block flag register 12a, and the column register 28 during the power-on state. Consequently, the data of the first ROM fuse 30a cannot be saved by the redundancy column. Here, in order to guarantee the reliability, in the first ROM fuse, for example, for the data of the column substituting information D1, it is necessary to hold the complementing data and the copy data. By carrying out the various computing operations for these data, for example, the reliably of the data of the column substituting information D1 is guaranteed.

The data of the second ROM fuse 30b and the data of the management block can be saved by the redundancy column. Consequently, there is no need to hold the complementing data and the copy data in the second ROM fuse and the management block, and there is no need to carry out various computing for the data. Consequently, it is possible to decrease the capacity of the second ROM fuse and the management block. According to the present embodiment, it is possible to shorten the power-on time as compared with the case when there are the complementing data and copy data in the data of the second ROM fuse and the management block.

(Sixth Embodiment)

In the following, the nonvolatile semiconductor memory device 1 and the controller 2 of the sixth embodiment will be explained.

Figure 26:
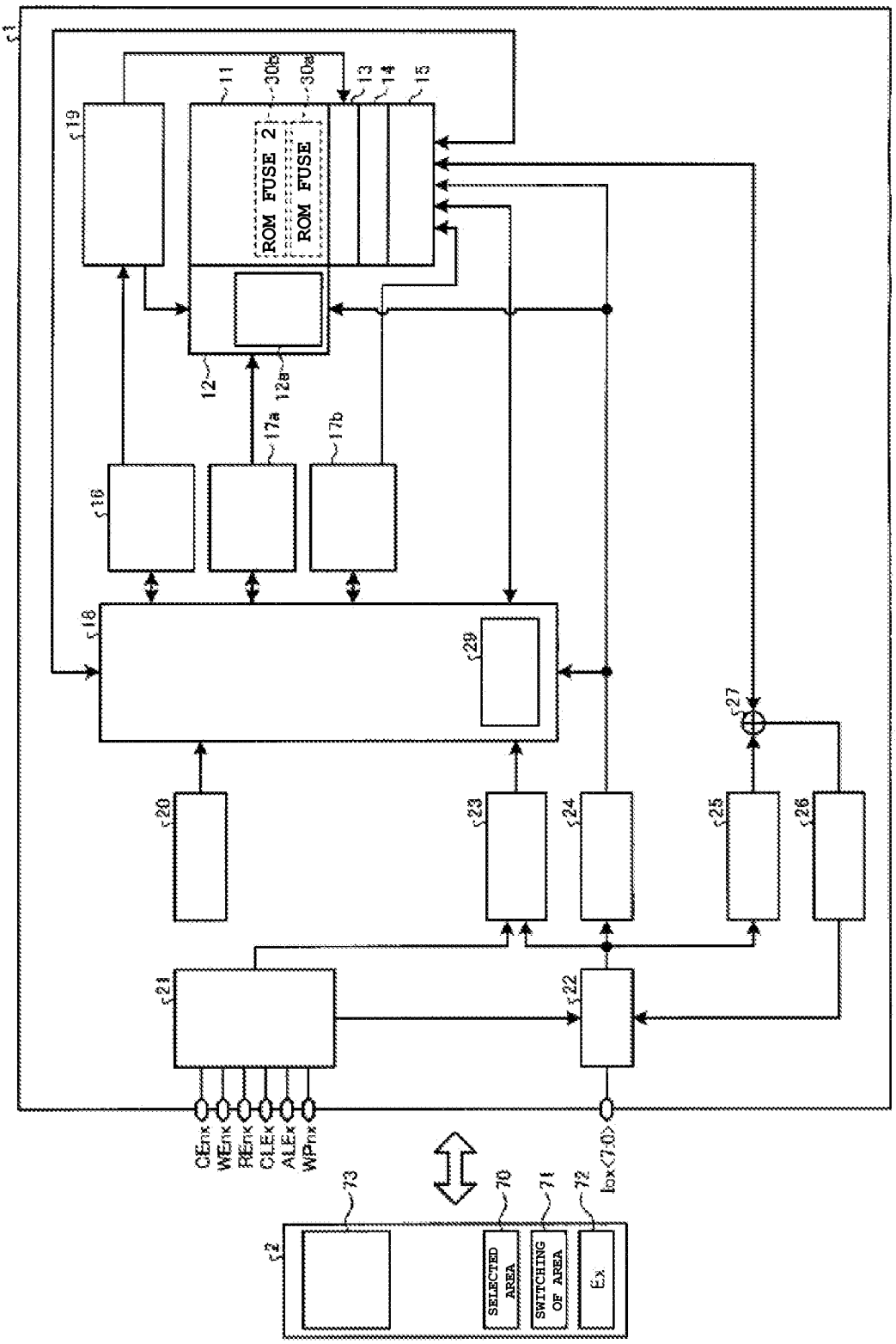
FIG. 26 is a schematic block diagram illustrating the constitution of the nonvolatile semiconductor memory device according to a sixth embodiment.

As shown in FIG. 26, a block diagram, the constitution of the nonvolatile semiconductor memory device in the present embodiment has the column substituting register 28 deleted from that of the fifth embodiment.

Figure 27:
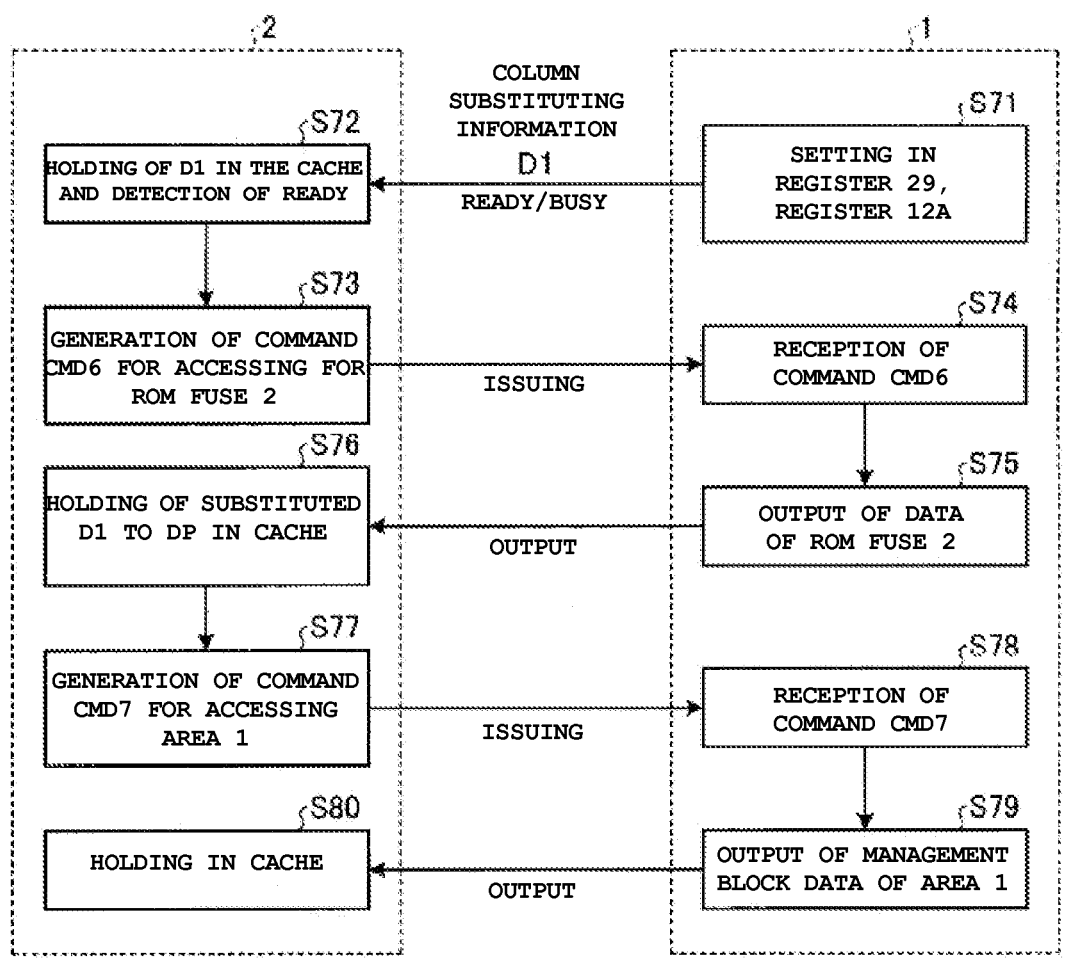
FIG. 27 is flow chart illustrating the operation after power-on of the nonvolatile semiconductor memory device shown in FIG. 26.

In the following, the sequence of the nonvolatile semiconductor memory device 1 and the controller 2 will be explained with reference to the flow chart shown in FIG. 27.

First, the operation of the nonvolatile semiconductor memory device in this embodiment during the power-on state will be explained. As shown in FIG. 27, when the nonvolatile semiconductor memory device 1 detects power-on, the sequence controller 18 accesses the first ROM fuse 30a, transfers the trimming information to the trimming register 29, and transfers the bad block information to the bad block flag register 12a. The trimming register 29 sets the trimming information, and the bad block flag register 12a sets the bad block information (S71). The nonvolatile semiconductor memory device 1 then outputs the column substituting information D1 to the controller 2 (S71).

The controller 2 sets the column substituting information D1 in the cache 73 (S72). Here, the area 1 is an area containing the management block (the block holding the acquired bad block information) and the second ROM fuse 30b.

After the end of the setting operation of the S71, the nonvolatile semiconductor memory device 1 outputs the ready information to the controller 2.

Then, on the basis of the ready information (S72), the controller 2 generates the command CMD6 (S73). This command CMD6 is a command that controls the nonvolatile semiconductor memory device 1 so that the nonvolatile semiconductor memory device 1 outputs the column substituting information pieces D1 to Dp of all of the areas held in the second ROM fuse 30b to the controller 2.

On the basis of the command CMD6 (S74), the nonvolatile semiconductor memory device 1 outputs the column substituting information D1 to Dp of all of the areas held in the second ROM fuse 30b to the controller 2 (S75). When the global defective column or the local defective column is present in the area 1 containing the second ROM fuse 30b, the controller 2 substitutes it on the basis of the column substituting information D1 held in the cache 73 and holds it in the cache 73 (S76).

The controller 2 generates the command CMD7 (S77). This command CMD7 is a command that controls the nonvolatile semiconductor memory device 1 so that the data of the management block of the area 1 (the delayed bad block information) are output to the controller 2.

On the basis of the command CMD7 (S78), the nonvolatile semiconductor memory device 1 outputs the data of the management block (delayed bad block information) to the controller 2 (S79). The controller 2 holds the data of the management block to the cache 73 (S80). If the global defective column or local defective column exists in the area 1 containing the second ROM fuse 30b, just as in S75, the controller 2 substitutes it on the basis of the column substituting information D1 held in the cache 73 and holds it in the cache 73 (S80).

In the following, the write operation of the nonvolatile semiconductor memory device will be explained.

The write operation of the present embodiment is carried out in page units. The page of the present embodiment is composed of plural cell transistors in the common string units U1 to Uq among the cell transistors that share the word line WL. The cell transistors of the column redundancy region among the cell transistors that share the word line WL are also contained in the page of the present embodiment.

The column redundancy region is also taken as a region that can be accessed by the user, data are not written in the cell transistors corresponding to the columns having the global defective column or local defective column, and this is taken as non-write state.

That is, in the write operation of the present embodiment, the controller applies the program voltage Vpp on the selected word line WL, and it applies, e.g., the intermediate voltage Vpass (such as 10 V) on the non-selected word lines WL2 to WLh+1.

Also, the write voltage (e.g., 0 V) is applied on the bit line BL1, and the write-inhibiting voltage (e.g., 2.5 V) is applied on the remaining bit lines BL2 to BLm. The desired potential is applied on the select gate lines SGD, SGD of the string unit U1, so that the select transistor DT is turned on, and a low voltage (such as 0 V) is applied on the select gate lines SGD and SGS of the other string units U2 to Uq, so that the select transistor DT is turned off.

When the write command is output to the nonvolatile semiconductor memory device 1 by the controller 2, the controller 2 inputs the address on the basis of the column substituting information pieces D1 to Dp of the cache 73.

The following will explain this in more detail.

When the data are written in the nonvolatile semiconductor memory device 1, the controller 2 determines which area Ex of the page to which the write subject belongs. The controller 2 controls the nonvolatile semiconductor memory device 1 so that the column substituting information Dx corresponding to the determined area Ex is read from the cache 73, the cell transistors corresponding to the global defective column or the local defective column are skipped (skipping), and the data are written. That is, the data are written sequentially in the plural cell transistors, excluding the skipped cell transistors from the all of the cell transistors of the page. The method for skipping the cell transistors corresponding to the global defective column or the local defective column is described in, e.g., Japanese Patent Application No. 2007-53358 with the title of "nonvolatile semiconductor memory device, and nonvolatile semiconductor memory system" filed on Mar. 2, 2007. Its entirety is incorporated in the specification of the present patent application.

In the following, the read operation of the nonvolatile semiconductor memory device will be explained with reference to FIG. 28.

Figure 28:
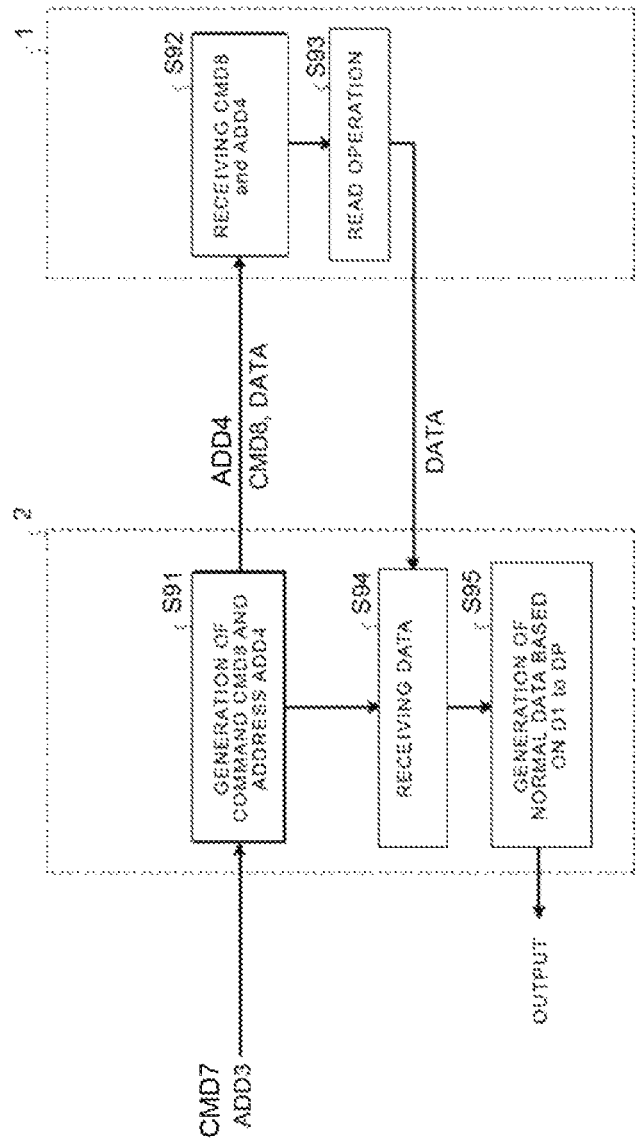
FIG. 28 is a flow chart illustrating the read operation of the nonvolatile semiconductor memory device shown in FIG. 26.

As shown in FIG. 28, the controller 2 receives the read command CMD7 and the address ADD3 from the external host equipment, and the controller 2 generates the command CMD8 that carries out the read operation and the corresponding address ADD4 from the memory cell array 11 (S91).

The controller 2 outputs the command CMD8 and the address ADD4 to the nonvolatile semiconductor memory device 1.

On the basis of the command CMD8 and the address ADD4 (S92), the nonvolatile semiconductor memory device 1 carries out the read operation. As a result, the data of 1 page are read (S93). Here, the data read from the cell transistor skipped in the write operation are FF.

The data read in S93 are output to the controller by the nonvolatile semiconductor memory device 1. Then, on the basis of the column substituting information pieces D1 to Dp of the cache 73, the controller 2 removes the data (FF) read from the skipped cell transistor from the data received in S93 (S94), and it generates the normal data (S95).

The controller 2 outputs the normal data to the external host equipment.

As previously explained, this embodiment can provide a nonvolatile semiconductor memory device that can improve the saving efficiency with respect to the defects.

According to the present embodiment, the controller 2 controls the nonvolatile semiconductor memory device 1 so that the column substituting information Dx corresponding to the determined area Ex is read from the cache 73, the cell transistors corresponding to the global defective column or the local defective column are skipped (skipping), and the data are written. Also, on the basis of the column substituting information pieces D1 to Dp of the cache 73, the controller 2 removes the data (FF) read from the skipped cell transistor from the data received in S93 (S94) and generates the normal data (S95). There is no need to carry out transfer of data using the redundancy column, and it is thus possible to significantly cut the time needed for the read operation as compared to the case in which data transfer is carried out.

While certain embodiments have been described, these embodiments have been presented by way of example only, and they are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
a memory cell array having memory cells arranged in user data columns and redundancy columns, each of which is divided into a plurality of areas; and
a storage area that holds column substituting information that identifies for at least one area one or more of the redundancy columns that are to be used as substitutes for a corresponding number of user data columns.

2. The nonvolatile semiconductor memory device according to claim 1, wherein the areas include at least first and second areas, and the first area includes a first portion of each of the user data columns and the redundancy columns, and the second area includes a second portion of each of the user data columns and the redundancy columns.

3. The nonvolatile semiconductor memory device according to claim 2, wherein:
the user data columns include first and second user data columns and the redundancy columns include first and second redundancy columns; and
the column substituting information identifies for the first area that the first redundancy column is to be used as a substitute for the first user data column and for the second area that the first redundancy column is to be used as a substitute for the second user data column.

4. The nonvolatile semiconductor memory device according to claim 1, wherein
a plurality of blocks are arranged in each of the areas.

5. The nonvolatile semiconductor memory device according to claim 3, wherein
when a certain block of an area has a defective column, a user data column that comprises the defective column is substituted by a redundancy column regardless of whether columns of other blocks of the area at the corresponding column location are defective.

6. The nonvolatile semiconductor memory device according to claim 5, wherein
when the number of defective columns of an area is larger than the number of available redundancy columns, one or more of the blocks that comprise the defective columns are converted to bad blocks.

7. The nonvolatile semiconductor memory device according to claim 6, wherein a block having the most number of defective columns is converted first.

8. The nonvolatile semiconductor memory device according to claim 1, wherein
the column substituting information comprises:
a global column substituting information common for all of the areas, and
individual local column substituting information for each of the areas.

9. The nonvolatile semiconductor memory device according to claim 1, wherein
the column substituting information further indicates whether any of the redundant columns are defective.

10. The nonvolatile semiconductor memory device according to claim 1, wherein
the memory cell array has plural memory cells arranged in a three-dimensional configuration.

11. A memory system comprising:
a nonvolatile semiconductor memory device including a memory cell array having memory cells arranged in user data columns and redundancy columns, each of which is divided into a plurality of areas, and a storage area that holds column substituting information that identifies for an area one or more of the redundancy columns that are to be used as substitutes for a corresponding number of user data columns; and
a controller configured to store information about the area corresponding to the column substituting information held in the storage area and issue a read command to the nonvolatile semiconductor memory device to perform a read using the column substituting information held in the storage area.

12. The memory system according to claim 11, wherein the controller is further configured to compare an area targeted in the read command with the area corresponding to the column substituting information held in the storage area and issue a new read command to the nonvolatile semiconductor memory device to store new column substituting information in the storage area if the areas do not match.

13. The memory system according to claim 12, wherein the nonvolatile semiconductor memory device further includes a read-only memory in which the new column substituting information is stored.

14. The memory system according to claim 12, wherein the controller further includes a cache in which the new column substituting information is stored and the controller sends the new column substituting information to the nonvolatile semiconductor memory device along with the new read command.

15. The memory system according to claim 11, wherein the areas include at least first and second areas, and the first area includes a first portion of each of the user data columns and the redundancy columns, and the second area includes a second portion of each of the user data columns and the redundancy columns.

16. The memory system according to claim 15, wherein:
the user data columns include first and second user data columns and the redundancy columns include first and second redundancy columns; and
the column substituting information identifies for the first area that the first redundancy column is to be used as a substitute for the first user data column and that the second redundancy column is to be used as a substitute for the second user data column.

17. In a memory system having a nonvolatile semiconductor memory device including a memory cell array having memory cells arranged in user data columns and redundancy columns, each of which is divided into a plurality of areas, and a storage area that holds column substituting information that identifies for an area one or more of the redundancy columns that are to be used as substitutes for a corresponding number of user data columns, a method of performing a read in response to a read command, comprising:
prior to receiving the read command, storing information about the area corresponding to the column substituting information held in the storage area;
upon receiving the read command, comparing an area targeted in the read command with the area corresponding to the column substituting information held in the storage area and issuing another command to the nonvolatile semiconductor memory device to store new column substituting information in the storage area if the areas do not match; and
issuing the read command to the nonvolatile semiconductor memory device to perform the read using the column substituting information held in the storage area.

18. The method according to claim 17, wherein the nonvolatile semiconductor memory device further includes a read-only memory in which the new column substituting information is stored.

19. The method according to claim 17, wherein the controller further includes a cache in which the new column substituting information is stored and the controller sends the new column substituting information to the nonvolatile semiconductor memory device along with the another command.

20. The method according to claim 17, wherein the cache stores column substituting information for all of the areas.

* * * * *